(12) United States Patent
Voldman

(10) Patent No.: US 7,705,426 B2
(45) Date of Patent: Apr. 27, 2010

(54) INTEGRATION OF A SIGE- OR SIGEC-BASED HBT WITH A SIGE- OR SIGEC-STRAPPED SEMICONDUCTOR DEVICE

(75) Inventor: Steven Voldman, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 397 days.

(21) Appl. No.: 11/558,480

(22) Filed: Nov. 10, 2006

(65) Prior Publication Data

US 2008/0111154 A1    May 15, 2008

(51) Int. Cl.
*H01L 29/10* (2006.01)
*H01L 29/737* (2006.01)

(52) U.S. Cl. .................. 257/592; 257/51; 257/197; 257/E29.045; 257/E29.188

(58) Field of Classification Search ............ 257/51, 257/197, 592, E29.045, E29.188
See application file for complete search history.

(56) References Cited

U.S. PATENT DOCUMENTS

| | | | |
|---|---|---|---|
| 5,793,065 A | 8/1998 | Shinohe et al. | |
| 6,259,134 B1 | 7/2001 | Amaratunga et al. | |
| 6,288,427 B2 * | 9/2001 | Huang | 257/350 |
| 6,368,920 B1 | 4/2002 | Beasom | |
| 6,627,924 B2 | 9/2003 | Hsu et al. | |
| 6,777,271 B1 | 8/2004 | Robins et al. | |
| 6,838,722 B2 | 1/2005 | Bhalla et al. | |
| 2002/0151130 A1 | 10/2002 | Hsu et al. | |
| 2004/0157387 A1 | 8/2004 | Yi et al. | |

(Continued)

FOREIGN PATENT DOCUMENTS

EP    0785582 A2    7/1997

(Continued)

OTHER PUBLICATIONS

H.R. Chang et al., "MOS Trench Gate Field-Controlled Thyristor," Technical Digest IEDM, 1989, pp. 293-296.

(Continued)

*Primary Examiner*—David Vu
*Assistant Examiner*—Earl N Taylor
(74) *Attorney, Agent, or Firm*—Scully, Scott, Murphy & Presser, P.C.; Anthony J. Canale, Esq.

(57) ABSTRACT

The present invention provides an integrated semiconductor device that includes a semiconductor substrate, a first device containing a heterojunction bipolar transistor (HBT) located in a first region of the semiconductor substrate, wherein the HBT includes a base region containing a first portion of a SiGe or SiGeC layer, and a second device located in a second region of the semiconductor substrate, wherein the second device includes an interconnect containing a second portion of the SiGe or SiGeC layer. In a specific embodiment of the present invention, the second device is a memory device including a trench capacitor and a field effect transistor (FET) that are electrically connected together by the second portion of the SiGe or SiGeC layer. Alternatively, the second device is a trench-biased PNPN silicon controlled rectifier (SCR). The present invention also provides a novel reversibly programmable device or a novel memory device formed by a novel trench-biased SCR device.

12 Claims, 38 Drawing Sheets

U.S. PATENT DOCUMENTS

| | | |
|---|---|---|
| 2004/0166636 A1 | 8/2004 | Darwish |
| 2005/0035402 A1 | 2/2005 | Venkatraman |

FOREIGN PATENT DOCUMENTS

| | | |
|---|---|---|
| GB | 2259608 A | 3/1993 |
| JP | 2000-223695 A | 8/2000 |
| JP | 2000-311998 A | 11/2000 |
| JP | 2003-318400 A | 11/2003 |
| JP | 2004-221097 A | 8/2004 |
| JP | 2004-349615 A | 12/2004 |
| KR | 2003-077186 A | 10/2003 |

OTHER PUBLICATIONS

M.S. Shekar et al., "Trench Gate Emitter Switched Thyristors," Proc. of the 6$^{th}$ International Symposium on Power Semiconductor Devices & IC's, 1994, pp. 189-194.

* cited by examiner

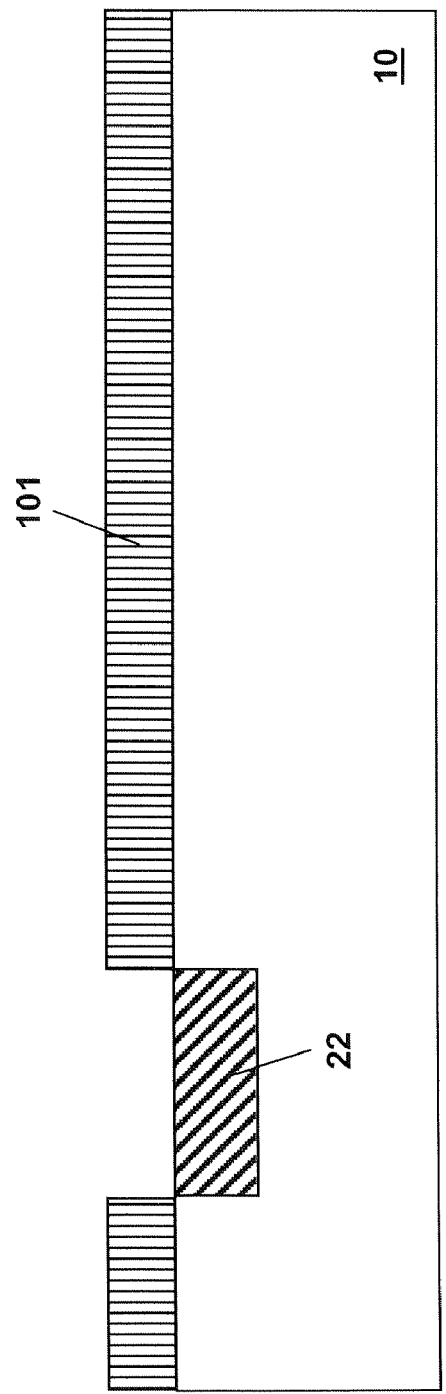
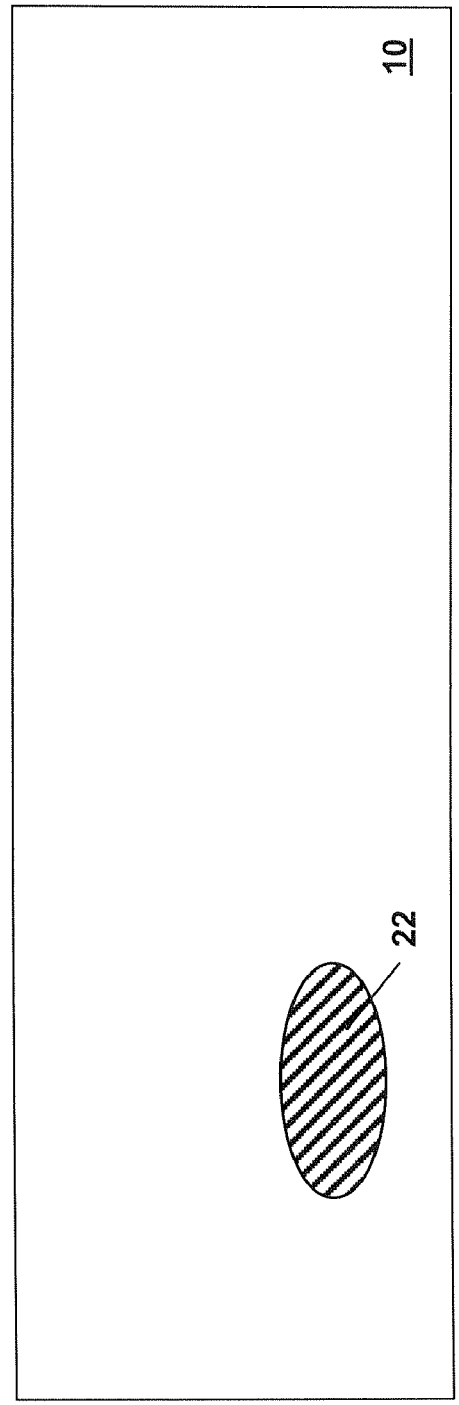
FIG. 4A
FIG. 4B

INTEGRATION OF A SIGE- OR SIGEC-BASED HBT WITH A SIGE- OR SIGEC-STRAPPED SEMICONDUCTOR DEVICE

FIELD OF THE INVENTION

The present invention generally relates to an integrated semiconductor device that contains a heterojunction bipolar transistor (HBT) device having a base region formed of a first portion of a SiGe or SiGeC layer and another semiconductor device having an interconnect formed of a second portion of the SiGe or SiGeC layer. Further, the present invention relates to a reversibly programmable device or a memory device that comprises a trench-biased PNPN silicon controlled rectifier (SCR).

BACKGROUND OF THE INVENTION

The ever-increasing use of mobile communications is driving improvements in radio frequency (RF) communications. In particular, this expanding market is demanding lower power consumption and increased performance.

One possible solution that has found many applications is bipolar complementary metal-oxide semiconductor (BiCMOS) technology. In standard bipolar complementary metal-oxide-semiconductor (BiCMOS) technology, the complementary metal-oxide-semiconductor (CMOS) processing steps are isolated from the bipolar processing steps, in order to avoid implant and process issues between the metal-oxide-semiconductor field effect transistors (MOSFETs) and the bipolar transistors. Additional processing steps are typically required for forming the bipolar transistors, which result in prolonged processing time and increased manufacturing costs.

There is a need for a method for integrating the bipolar transistor processing steps with the conventional CMOS process, with few or no additional processing steps. With system-on-chip (SOC), and network-on-chip (NOC), the demand for digital, analog and RF circuits as well as logic and memory devices on a common chip is high. In wired and wireless communication systems, the desire for CMOS, RF CMOS, RF laterally diffused metal oxide semiconductor (LDMOS), RF BiCMOS SiGe or SiGeC, and gallium arsenide technologies is increasing. As a result, it is desirable to form HBT-based devices with memory, circuits with hysteresis, and high voltage devices, in a common system. Additionally, it is desirable to enable voltage controlling and power controlling applications at 25 V and 40 V by integrate SiGe HBT devices and high voltage circuits.

Further, power control applications over 40 V require electrical static discharge (ESD) networks that have trigger conditions above the power supply voltage. In power technologies that utilize LDMOS transistors require both 25 V and 40 V power supply conditions. In standard CMOS technology, with low voltage junction and well breakdown voltages, the ability to provide ESD networks in this voltage range is impossible. In standard CMOS technology, the breakdown voltages of n-well regions can be below 40 V, which prevent formation of silicon controlled rectifiers (SCRs) in the p-diffusion region, the n-well region, the p-substrate and the n-diffusion region.

There is a continuing need for improved SCRs with higher trigger conditions, which can be employed as ESD structures in greater than 40 V power supply conditions. It is desirable to integrate high voltage elements into CMOS, high voltage CMOS, or RF BiCMOS SiGe systems. Today, there is no such an integrated system with high voltage elements, such as high voltage SCRs, integrated into CMOS or BiCMOS SiGe/SiGeC applications. Additionally, due to the cost associated with BiCMOS technology, it is desirable to form such an integrated system without additional masking steps or cost.

SUMMARY OF THE INVENTION

In one aspect, the present invention relates to an integrated semiconductor device, which comprises:

a semiconductor substrate;

a first semiconductor device comprising a heterojunction bipolar transistor (HBT) located in a first region of the semiconductor substrate, wherein the HBT comprises a base region containing a first portion of a SiGe or SiGeC layer; and a second semiconductor device located in a second region of the semiconductor substrate, wherein the second semiconductor device comprises an interconnect containing a second portion of the SiGe or SiGeC layer.

Preferably, but not necessary, the second portion of the SiGe or SiGeC layer comprises different sections of different crystallinity. For example, the second portion of the SiGe or SiGeC layer may comprise a polycrystalline section and a single crystalline section.

In a specific embodiment of the present invention, the second semiconductor device is a memory device that includes a trench capacitor and a field effect transistor (FET), which are electrically connected together by the second portion of the SiGe or SiGeC layer.

In an alternative embodiment of the present invention, the second semiconductor device is a trench-biased PNPN silicon controlled rectifier (SCR), provided that the semiconductor substrate is doped with a p-type dopant. The trench-biased PNPN SCR includes a p-type anode that is located over an n-well in the p-doped semiconductor substrate, an n-type cathode that is located over the p-doped semiconductor substrate and is spaced apart from the n-well, and a polysilicon-filled trench that is located in the semiconductor substrate abutting the n-well region. Specifically, the second portion of the SiGe or SiGeC layer is located over and electrically contacts the polysilicon-filled trench for applying a bias voltage to the trench.

The trench-biased PNPN SCR may contain five electrodes, including the p-type anode, the n-type cathode, a first additional electrode electrically connected with the n-well, a second additional electrode electrically connected with the p-doped semiconductor substrate, and a third additional electrode electrically connected with the second portion of the SiGe or SiGeC layer.

Alternatively, if the second portion of the SiGe or SiGeC layer extends to form further electrical contact with the p-doped semiconductor substrate, the trench-biased PNPN SCR then may contain only four electrodes instead, which include the p-type anode, the n-type cathode, a first additional electrode electrically connected with the n-well, and a second additional electrode electrically connected with the second portion of the SiGe or SiGeC layer.

Further, if the second portion of the SiGe or SiGeC layer extends to form further electrical contact with the n-well, the trench-biased PNPN SCR then may contain only four electrodes, which include the p-type anode, the n-type cathode, a first additional electrode electrically connected with the p-doped semiconductor substrate, and a second additional electrode electrically connected with the second portion of the SiGe or SiGeC layer.

In another aspect, the present invention relates to a method for forming an integrated semiconductor device, which comprises:

providing a semiconductor substrate;

forming a first semiconductor device comprising a heterojunction bipolar transistor (HBT) in a first region of the semiconductor substrate and a second semiconductor device in a second region of the semiconductor substrate;

forming a SiGe or SiGeC layer over the first and second regions, wherein a first portion of the SiGe or SiGeC layer forms a base region in the HBT, and wherein a second portion of the SiGe or SiGeC layer forms an interconnect in the second semiconductor device.

In yet another aspect, the present invention relates to a semiconductor structure comprising:

a doped semiconductor substrate having a first conductivity type;

a doped well region located in the doped semiconductor substrate, wherein the doped well region has a second, opposite conductivity type;

a first doped layer located over a first portion of the doped well region, wherein the first doped layer has the first conductivity type;

a second doped layer located over a first portion of the doped semiconductor substrate and spaced apart from the doped well region, wherein the second doped layer has the second, opposite conductivity type;

a trench located in the doped semiconductor substrate and abutting the doped well region, wherein said trench comprises a conductive or semiconductor trench fill; and a conductive layer located over and electrically connected with the trench for applying a bias voltage to the trench fill.

Preferably, but not necessarily, the trench fill comprises polysilicon. Further, it is preferred that the conductive layer comprises SiGe or SiGeC.

In a specific embodiment of the present invention, the first conductivity type is p-type, and the second conductivity type is n-type. In this manner, the semiconductor structure comprises a trench-biased PNPN SCR.

More specifically, the trench-biased PNPN SCR device of the present invention may comprise five electrodes, including an anode electrically connected with the first doped layer of p-type conductivity, a cathode electrically connected with the second doped layer of n-type conductivity, a first additional electrode electrically connected with the p-doped semiconductor substrate, a second additional electrode electrically connected with the n-doped well region, and a third additional electrode electrically connected with the conductive layer. Alternatively, if the conductive layer extends to form further electrical contact with the p-doped semiconductor substrate, the trench-biased PNPN SCR then may contain only four electrodes instead, which include an anode electrically connected with the first doped layer of p-type conductivity, a cathode electrically connected with the second doped layer of n-type conductivity, a first additional electrode electrically connected with the n-doped well region, and a second additional electrode electrically connected with the conductive layer. Further, if the conductive layer extends to form further electrical contact with the n-doped well region, the trench-biased PNPN SCR then may contain four electrodes, which include an anode electrically connected with the first doped layer of p-type conductivity, a cathode electrically connected with the second doped layer of n-type conductivity, a first additional electrode electrically connected with the p-doped semiconductor substrate, and a second additional electrode electrically connected with the conductive layer.

In an alternative embodiment of the present invention, the first conductivity type is n-type, and the second conductivity type is p-type. Therefore, the semiconductor structure comprises a trench-biased NPNP SCR.

In a further aspect, the present invention relates to a reversibly programmable device, comprising:

a doped semiconductor substrate having a first conductivity type;

a doped well region located in the doped semiconductor substrate, wherein the doped well region has a second, opposite conductivity type;

a first doped layer located over a first portion of the doped well region, wherein the first doped layer has the first conductivity type;

a second doped layer located over a first portion of the doped semiconductor substrate and spaced apart from the doped well region, wherein the second doped layer has the second, opposite conductivity type;

a trench located in the doped semiconductor substrate and abutting the doped well region, wherein the trench comprises a conductive or semiconductor trench fill; and a conductive layer located over and electrically connected with the trench for applying a bias voltage to the trench fill, wherein the reversible programmable device has an unbiased trigger voltage after a ground voltage is applied to the trench fill and at least a first biased trigger voltage that is higher than the unbiased trigger voltage after a first positive bias voltage is applied to the trench fill.

Such a reversible programmable device may have one or more additional biased trigger voltages, which are different from the first biased trigger voltage but higher than the unbiased trigger voltage, after additional positive bias voltages that are different from the first positive bias voltage are applied to the trench fill.

In a still further aspect, the present invention relates to a memory device that comprises a reversibly programmable device as described-hereinabove. Specifically, the memory device of the present invention is in a base state characterized by the unbiased trigger voltage, or a first programmed state characterized by the first biased trigger voltage, or an additional programmable state characterized by one of the additional biased trigger voltages.

In yet another aspect, the present invention relates to a method for programming a reversibly programmable device, comprising:

providing a reversibly programmable device that comprises: (1) a doped semiconductor substrate having a first conductivity type, (2) a doped well region located in the doped semiconductor substrate, wherein the doped well region has a second, opposite conductivity type, (3) a first doped layer located over a first portion of the doped well region, wherein the first doped layer has the first conductivity type, (4) a second doped layer located over a first portion of the doped semiconductor substrate and spaced apart from the doped well region, wherein the second doped layer has the second, opposite conductivity type, (5) a trench located in the doped semiconductor substrate and abutting the doped well region, wherein the trench comprises a conductive or semiconductor trench fill, and (6) a conductive layer located over and electrically connected with the trench for applying a bias voltage to the trench fill;

applying a ground voltage to the trench fill through the conductive layer, thereby setting the reversibly programmable device to a base state characterized by an unbiased trigger voltage; and applying a first positive bias voltage to the trench fill through the conductive layer, thereby setting the reversibly programmable device to a first programmed state characterized by a first biased trigger voltage that is higher than the unbiased trigger voltage.

Further, one or more additional positive bias voltages, which are different from the first positive bias voltage, can be applied to the trench fill so as to set the reversibly programmable device to one or more additional programmed states, which are characterized by additional bias trigger voltages that are different from the first bias trigger voltage but higher than the unbiased trigger voltage. The ground voltage, the first positive bias voltage, or the one or more additional positive bias voltages can be repeatedly applied to the trench fill, in order to set the reversibly programmable device to the base state, the first programmable state, or the one or more additional programmed states.

In a still further aspect, the present invention is related to a static random memory cell containing at least two trench-biased silicon controlled rectifier (SCR) devices that are cross-coupled with each other to form a latch network.

Other aspects, features and advantages of the invention will be more fully apparent from the ensuing disclosure and appended claims.

BRIEF DESCRIPTION OF THE DRAWINGS

FIGS. 4A-4K show exemplary processing steps for forming the integrated semiconductor device of FIG. 1, according to one embodiment of the present invention.

DETAILED DESCRIPTION OF THE INVENTION, AND PREFERRED EMBODIMENTS THEREOF

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The present invention provides an integrated semiconductor device that comprises a HBT with a base region formed by a first portion of a SiGe or SiGeC layer and a second semiconductor device with an interconnect formed by a second portion of the SiGe or SiGeC layer. The HBT and the second semiconductor device can be formed in the same semiconductor substrate by an integrated process that simultaneously fabricates various structural components of the HBT and the second semiconductor device, thereby significantly reducing the processing time and the manufacturing costs.

The term "SiGe" as used herein refers to an alloy having a formula of $Si_{1-x}Ge_x$ (where $0<x<1$). The term "SiGeC" as used herein refers to either a ternary alloy having a formula of $Si_{1-x-y}Ge_xC_y$ (where $0<x<1$, $0<x<1$, and $0<x+y<1$) or an alloy of silicon and germanium with carbon incorporation therein.

In a specific embodiment of the present invention, the second semiconductor device is a memory device, e.g., a DRAM cell, that contains a trench capacitor and a field effect transistor (FET) strapped (i.e., electrically connected) together by the second portion of the SiGe or SiGeC layer.

Figure 1:
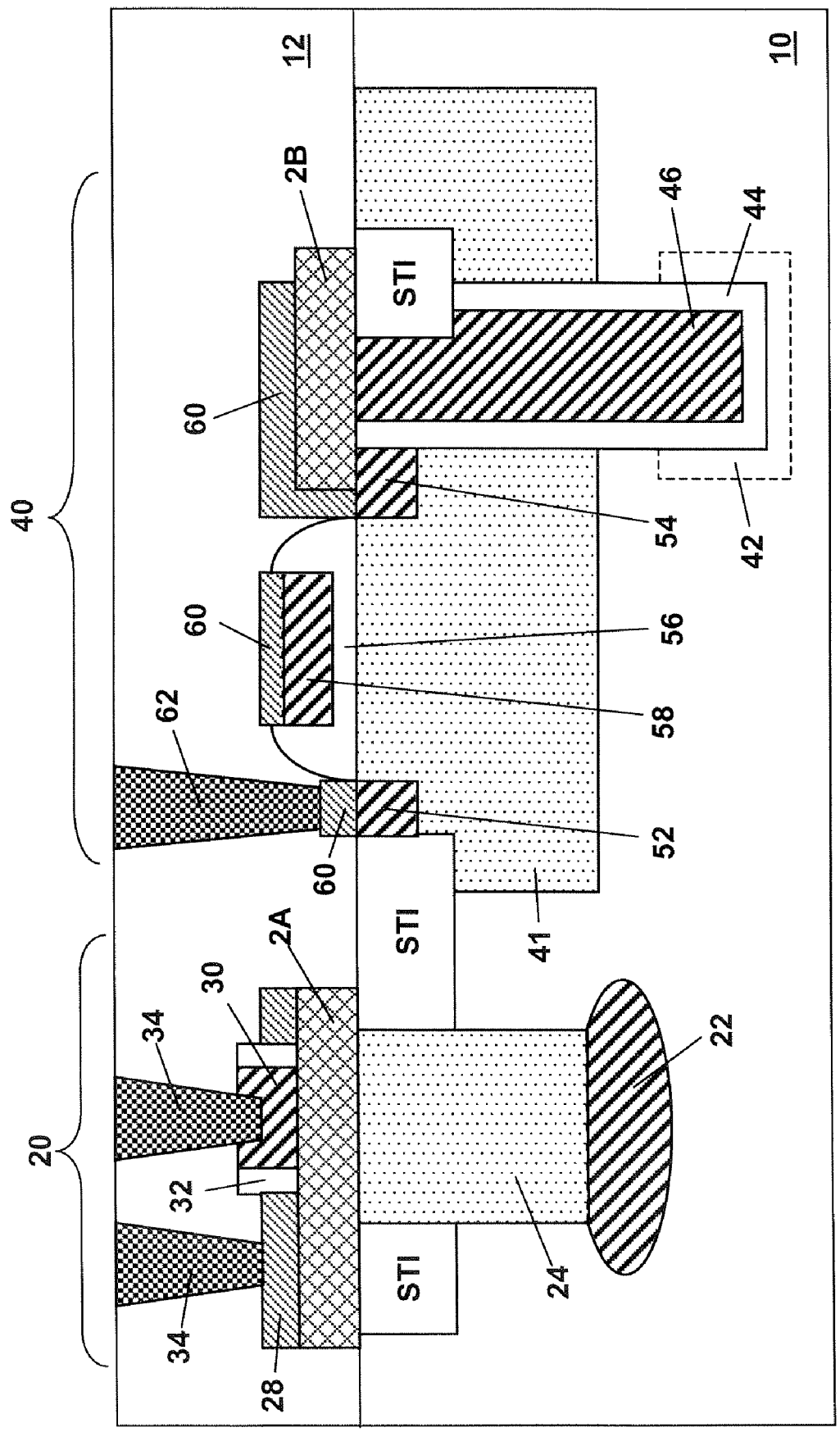
FIG. 1 shows a cross-sectional view of an exemplary integrated semiconductor device that comprises a HBT with a base region formed by a first portion of a SiGe or SiGeC layer and a dynamic random access memory (DRAM) cell with an interconnect formed by a second portion of the SiGe or SiGeC layer, according to one embodiment of the present invention.

FIG. 1 shows a cross-sectional view of an exemplary integrated semiconductor device that comprises a HBT 20 and a DRAM cell 40. Specifically, the HBT 20 is located in a first region of a semiconductor substrate 10, and the DRAM cell 40 is located in a second region of the semiconductor substrate 10.

The semiconductor substrate 10 employed in the present invention may comprise any semiconductor material including, but not limited to: undoped Si, n-doped Si, p-doped Si, single crystal Si, polycrystalline Si, amorphous Si, Ge, SiGe, SiC, SiGeC, Ga, GaAs, InAs, InP and all other III/V or II/VI compound semiconductors. Semiconductor substrate 10 may also comprise an organic semiconductor or a layered semiconductor such as Si/SiGe, a silicon-on-insulator (SOI) or a SiGe-on-insulator (SGOI).

In preferred embodiments of the present invention, the semiconductor substrate 10 is composed of a Si-containing semiconductor material, i.e., a semiconductor material that includes silicon, such as Si (including undoped Si, n-doped Si, p-doped Si, single crystal Si, polycrystalline Si, and amorphous Si), SiGe, SiGeC, etc. The silicon contained in the semiconductor substrate 10 can react with a subsequently deposited silicide metal to form metal silicide contacts. On the other hand, it is also contemplated by the present invention that the semiconductor substrate 10 may not comprise silicon, and a patterned silicon-containing layer (not shown) is subsequently formed over the semiconductor substrate 10 for formation of metal silicide contacts.

The semiconductor substrate 10 may be doped, undoped or contain both doped and undoped regions therein. These doped regions are known as "wells" and can be used to define various device regions. For example, the second region of the semiconductor substrate 10 (i.e., where the DRAM cell is located) may represent a doped (n- or p-) region 41. Typically, an n-doped region is provided for forming a p-channel field effect transistor (p-FET), and a p-doped region is provided for forming an n-channel field effect transistor (n-FET).

One or more dielectric isolation regions (e.g., shallow trench isolation or STI regions) are typically provided in the semiconductor substrate 10 to isolate the adjacent device regions from each other. The dielectric isolation regions may be a trench isolation region or a field oxide isolation region. The trench isolation region is formed utilizing a conventional trench isolation process well known to those skilled in the art. For example, lithography, etching and filling of the trench with a trench dielectric may be used in forming the trench isolation region. Optionally, a liner may be formed in the trench prior to trench fill, a densification step may be performed after the trench fill and a planarization process may follow the trench fill as well. The field oxide may be formed utilizing a so-called local oxidation of silicon process.

The HBT device 20 comprises a sub-collector 22 and a collector 24 that are located in the semiconductor substrate 10. A base layer comprising a first portion 2A of a SiGe or SiGeC layer is formed over the collector 24 with an optional metal silicide contact layer 28 located thereover. Emitter 30 located between dielectric spacers 32 is formed over an upper surface of the HBT base layer 2A, and conductive plugs 34 provide respective electrical contacts to the emitter 30 and the HBT base layer 2A. The DRAM cell 40, on the other hand, comprises a trench capacitor and a FET. Specifically, the trench capacitor contains a buried plate (i.e., an outer electrode) 42, a node dielectric layer 44, and a conductive trench fill (i.e., an inner electrode) 46. The FET contains a source 52, a drain 54, a gate dielectric layer 56, a gate conductor 58. A conductive strap or an interconnect, which is formed by a second portion 2B of the SiGe or SiGeC layer as mentioned hereinabove, is located between the trench capacitor and the FET for electrically connecting the drain 54 of the FET with the conductive trench fill 46 of the trench capacitor. Optional metal silicide contact layers 60 can be formed over the source 52 and drain 54 of the FET and the DRAM strap 2B, while conductive plug 62 provides electric contact to the source 52 of the FET. An interlevel dielectric (ILD) 12 is then deposited over the entire structure to cover both the HBT device 20 and the DRAM cell 40.

Note that the HBT device as shown in FIG. 1 contains a sub-collector 22 and a collector 24 that are defined only by the doping levels, according to a specific embodiment of the present invention. However, in an alternative embodiment of the present invention, the HBT device of the present invention can be further defined by a trench structure that encircles both the sub-collector and the collector of the HBT device.

Figure 2:
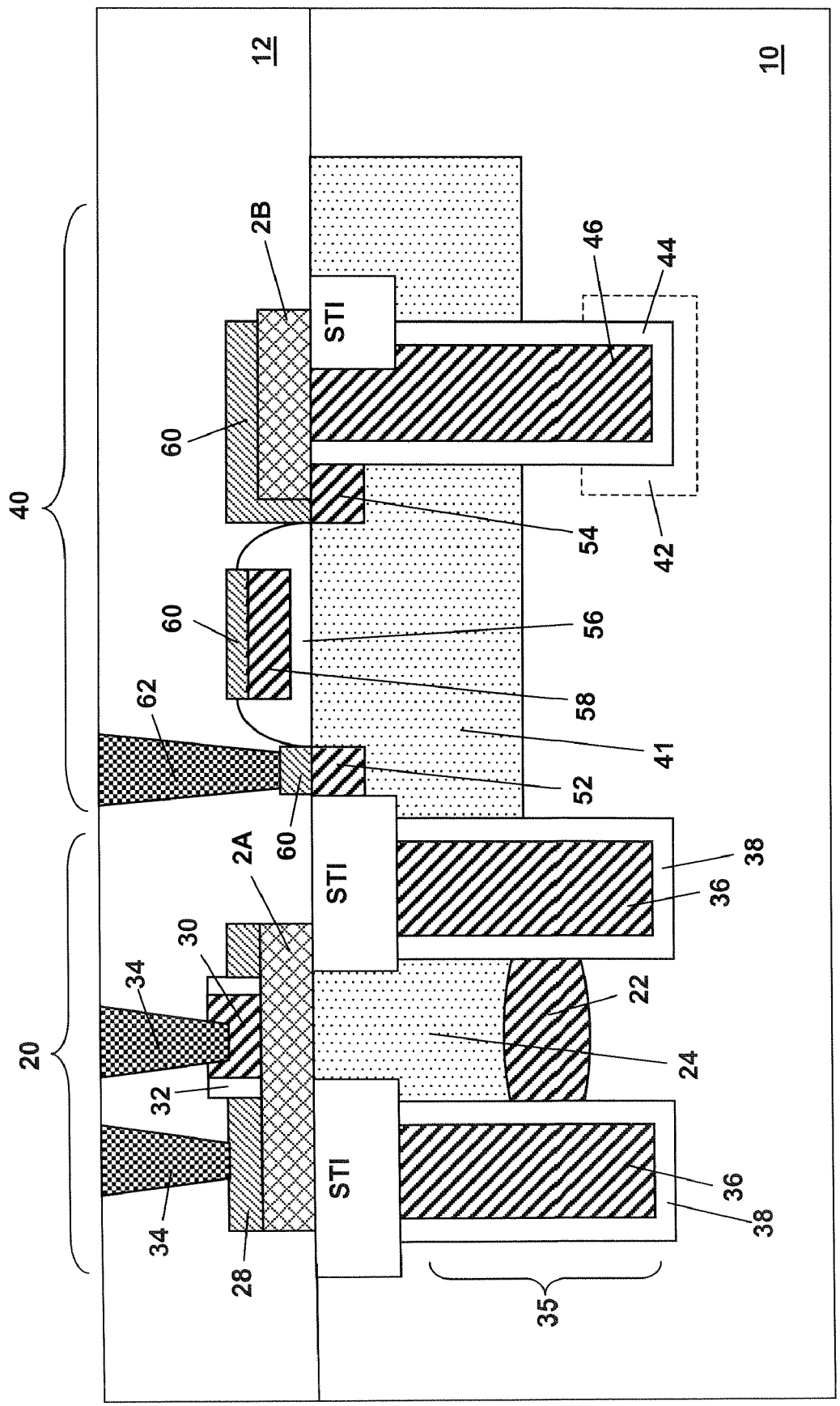
FIG. 2 shows a cross-sectional view of an exemplary integrated semiconductor device similar to that shown by FIG. 1, with the exception that the HBT has a sub-collector region and a collector region that are encircled by a trench structure, according to one embodiment of the present invention.

FIG. 2 shows an integrated semiconductor device that is substantially the same as that shown in FIG. 1, with the exception that the sub-collector 22 and the collector 24 of the HBT device 20 are further defined by a ring-shaped trench structure 35, which encircles the sub-collector 22 and the collector 24. Specifically, the trench structure 35 includes an insulator liner 38 and is filled by a conductive material or a semiconductor 36. Further, the opening of the trench structure 35 is completely capped by shallow trench isolations, thereby leaving the conductive or semiconductor trench fill 36 "floating." Such a trench definition as shown in FIG. 2 reduces the capacitance of the sub-collector 22 and the collector 24.

In another specific embodiment of the present invention, the second semiconductor device of the integrated semiconductor device is a novel trench-biased PNPN SCR device that contains a polysilicon-filled trench with a trench contact formed by the second portion of the SiGe or SiGeC layer.

Figure 3:
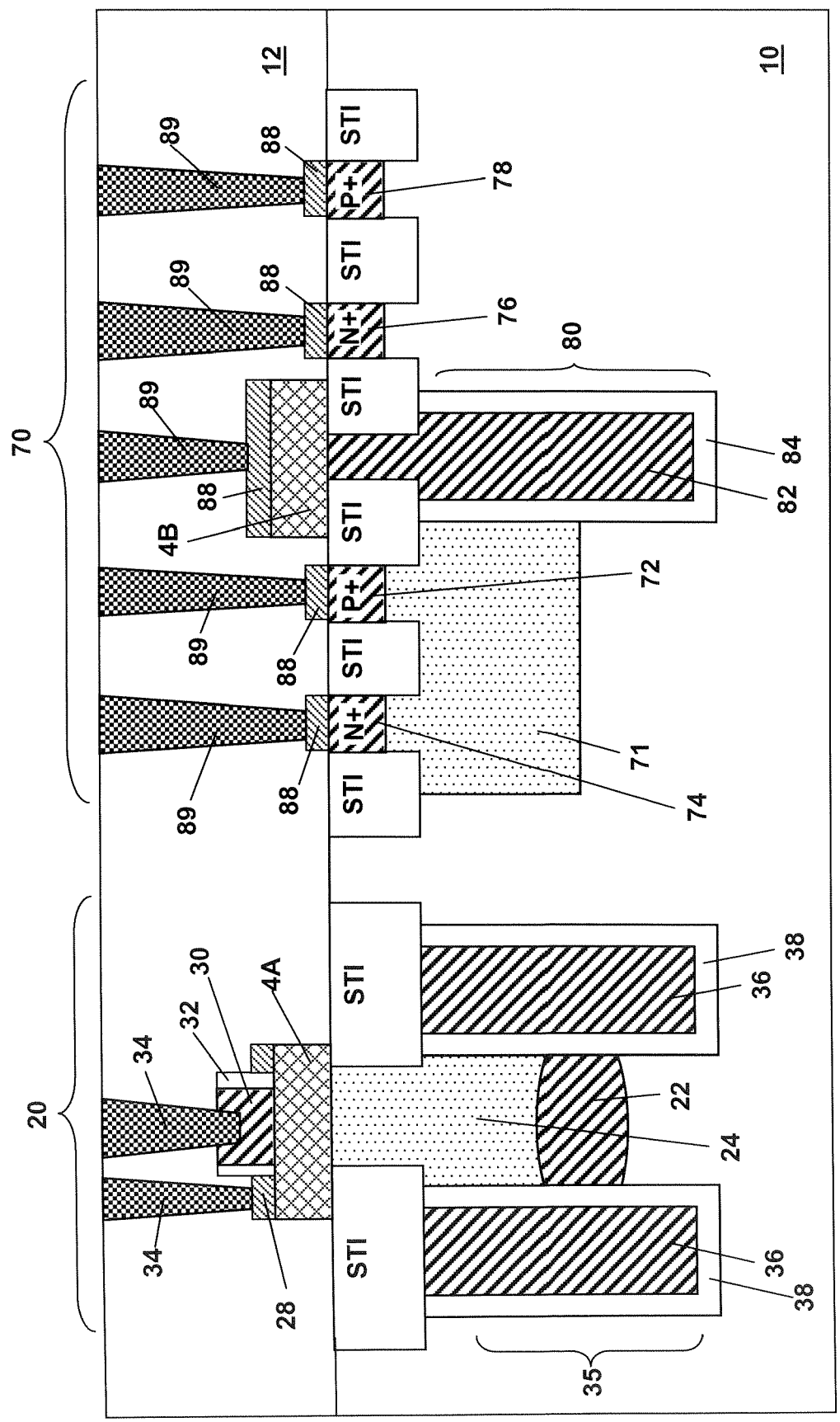
FIG. 3 shows a cross-sectional view of an exemplary integrated semiconductor device that comprises a HBT with a base region formed by a first portion of a SiGe or SiGeC layer and a trench-biased PNPN silicon controlled rectifier (SCR) with a trench contact formed by a second portion of the SiGe or SiGeC layer, according to one embodiment of the present invention.

FIG. 3 shows a cross-sectional view of an exemplary integrated semiconductor device that comprises a HBT 20 and a trench-biased PNPN SCR device 70.

Specifically, the HBT device 20 comprises a sub-collector 22 and a collector 24 located in the semiconductor substrate 10. A base layer comprising a first portion 4A of a SiGe or SiGeC layer is formed over the collector 24 with an optional metal silicide contact layer 28 located thereover. Emitter 30 located between dielectric spacers 32 is formed over an upper surface of the HBT base layer 4A, and conductive plugs 34 provide respective electrical contacts to the emitter 30 and the HBT base layer 4A.

The trench-biased PNPN SCR device 70, on the other hand, comprises: (1) a p-type anode 72 that is located over an n-well 71 in the semiconductor substrate 10, which is doped with a p-type dopant species in this specific embodiment, (2) an n-type cathode 76 that is located over the p-doped semiconductor substrate 10 and is spaced apart from the n-well 71, and (3) a trench 80 that is located in the semiconductor substrate 10 abutting the n-well 71 and contains an insulator liner 84 with a polysilicon trench fill 82. A trench contact formed by a second portion 4B of the SiGe or SiGeC layer is located over and electrically contacts the polysilicon-filled trench 80 for applying a bias voltage to the trench 80.

Optionally, an n-doped surface contact layer 74 can be provided over the n-well 71, while spaced apart and isolated from the p-type anode 72 by STI. Further, an optional p-doped surface contact layer 78 can be provided over the p-doped semiconductor substrate 10, while spaced apart and isolated from the n-type cathode 76 by STI. Surface metal silicide layers 88 and conductive plugs 89 can also be formed over the p-type anode 72, the n-doped surface contact layer 74, the n-type cathode 76, and the p-doped surface contact layer 78 to provide electrical contacts to the trench-biased PNPN SCR device 70.

As mentioned hereinabove, the HBT and the second semiconductor device (e.g., the DRAM cell as shown in FIGS. 1 and 2 or the trench-biased PNPN SCR device as shown in FIG. 3) can be readily formed in the same semiconductor substrate by an integrated process that simultaneously fabricates various structural components of the HBT and the second semiconductor device, thereby significantly reducing the processing time and the manufacturing costs.

FIGS. 4A-4K show the exemplary processing steps of an integrated process for forming the HBT and the DRAM cell of FIG. 1, according to one embodiment of the present invention.

Reference is first made to FIG. 4A, which shows formation of a patterned dielectric mask 101 over a semiconductor substrate 10. The patterned dielectric mask 101 is formed by first depositing a blanket dielectric mask layer (not shown) over the entire substrate 10, followed by patterning the blanket dielectric mask layer to form one or more openings thereof. The blanket dielectric mask layer may comprise any suitable dielectric masking material(s), including, but not limited to: oxides, nitrides, and oxynitrides. Preferably, but not necessarily, the blanket dielectric mask layer comprises silicon nitride. The blanket dielectric mask layer may be formed by any conventional deposition process, including, but not limited to: chemical vapor deposition (CVD), plasma-enhanced CVD, sputtering, evaporation, chemical solution deposition, and other like deposition processes. Alternatively, it may be formed by a conventional thermal oxidation, nitridation or oxynitridation process. The processes that can be used for patterning the blanket dielectric mask layer are well known in the art and are therefore not described in detail here. Preferably, the blanket dielectric mask layer is patterned by conventional processes such as lithography or RIE.

Next, a first ion implantation step is carried out to implant an n-type dopant species (for forming NPN HBT device) or a p-type dopant species (for forming PNP HBT device) into the semiconductor substrate 10 to form the sub-collector 22, as shown in FIG. 4A.

After the first ion implantation, the patterned dielectric mask 101 is removed from the semiconductor substrate 10, followed by epitaxial growth of semiconductor material over the semiconductor substrate 10 to form a sub-collector 22 that is entirely buried in an extended semiconductor substrate 10, as shown in FIG. 4B.

Figure 4C:
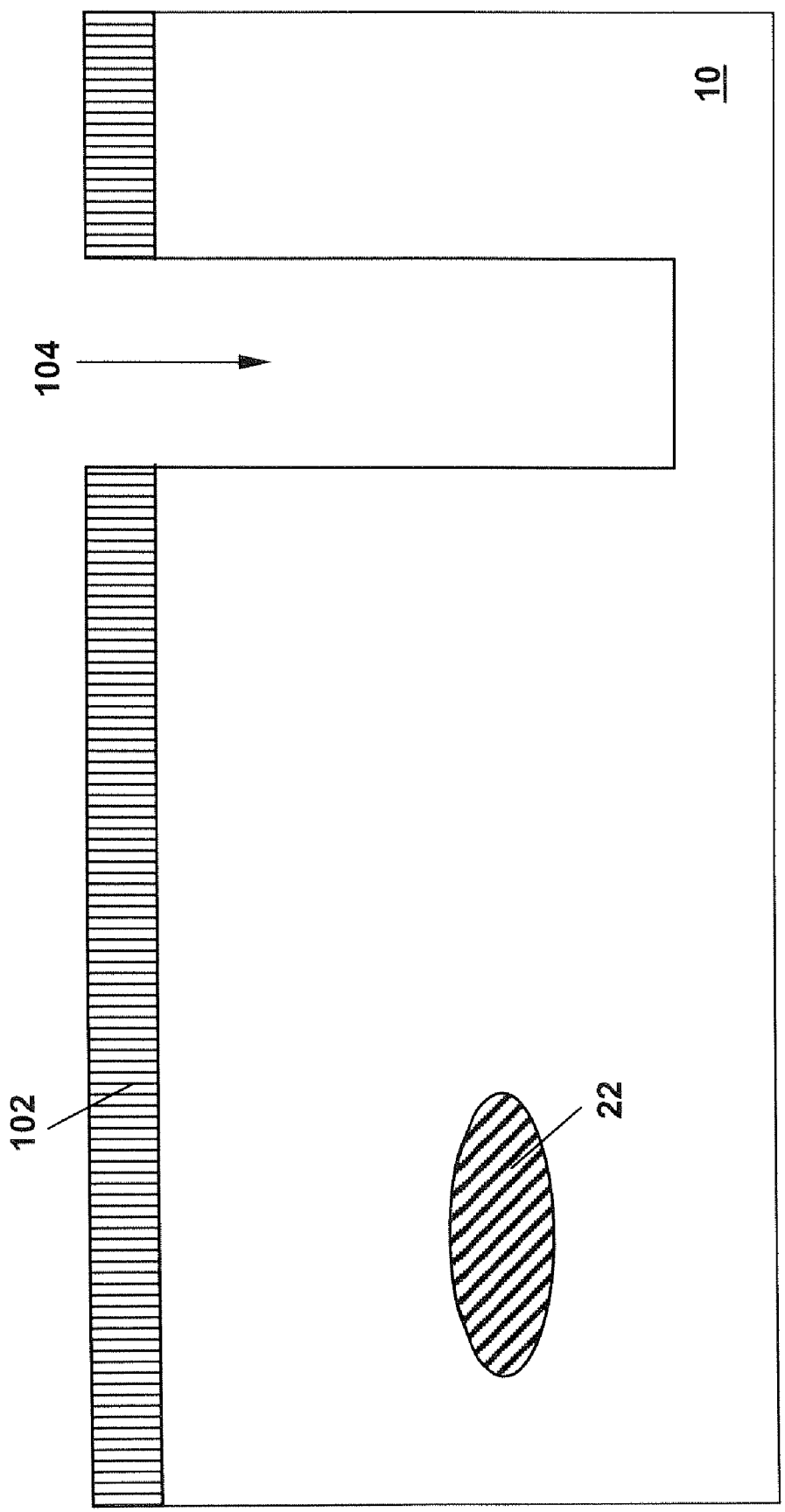

A photoresist block mask 102 is then formed over the extended semiconductor substrate 10, followed by trench etching to form a deep trench 104 in the semiconductor substrate 10, as shown in FIG. 4C. The trench etching process used in the present invention is preferably, but not necessarily, a plasma-based reactive ion etching (RIE) process or any other dry etching process. The deep trench 104 preferably has a depth of about 1 to 10 μm, and more preferably of about 1 to 3 μm.

Figure 4D:
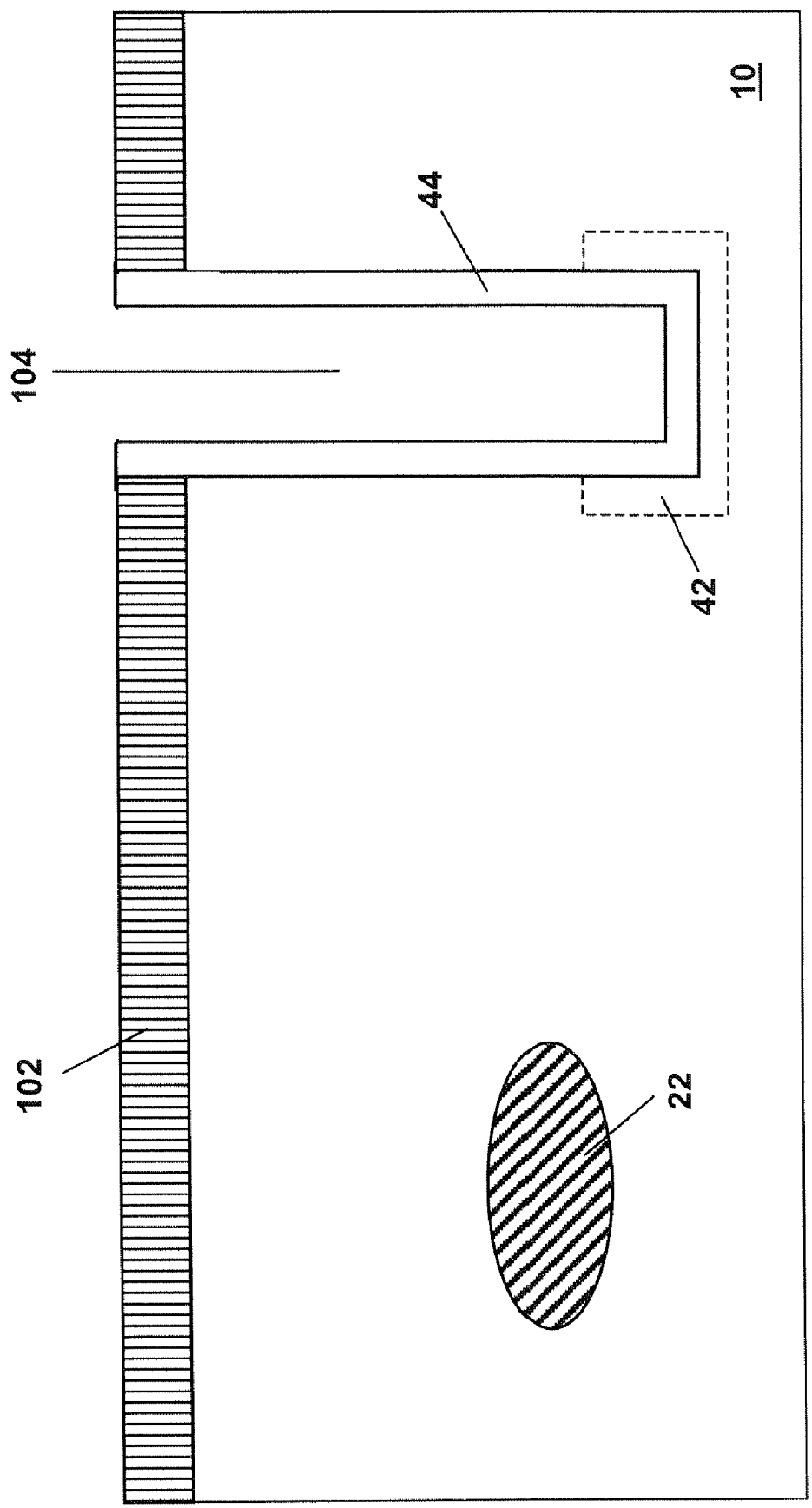

Subsequently, a buried plate 42 (i.e., the outer electrode of the trench capacitor 40 as shown in FIGS. 1 and 2) is formed in the semiconductor substrate 10 at a lower portion of the deep trench 104 by a second ion implantation step, and a node dielectric layer 44 is deposited over the interior surfaces of the deep trench 104, as shown in FIG. 4D. The node dielectric layer 44 may comprise any dielectric material, including, but not limited to: silicon oxide, aluminum oxide, hafnium oxide, barium strontium oxide, etc. Preferably, the node dielectric layer 44 comprises a high-k (i.e., k>4.0) dielectric material, such as aluminum oxide ($Al_2O_3$) and hafnium oxide ($HfO_2$), which allows use of relatively shallow trenches for achieving a required capacitance for the trench capacitors, e.g., about 20 fF, thereby reducing the required device processing time. The node dielectric layer 44 may be deposited by any suitable dielectric deposition techniques, including, but not limited to: ALD, CVD, and PVD. The thickness of the node dielectric layer 44 preferably ranges from about 40 Å to about 500 Å.

Figure 4E:
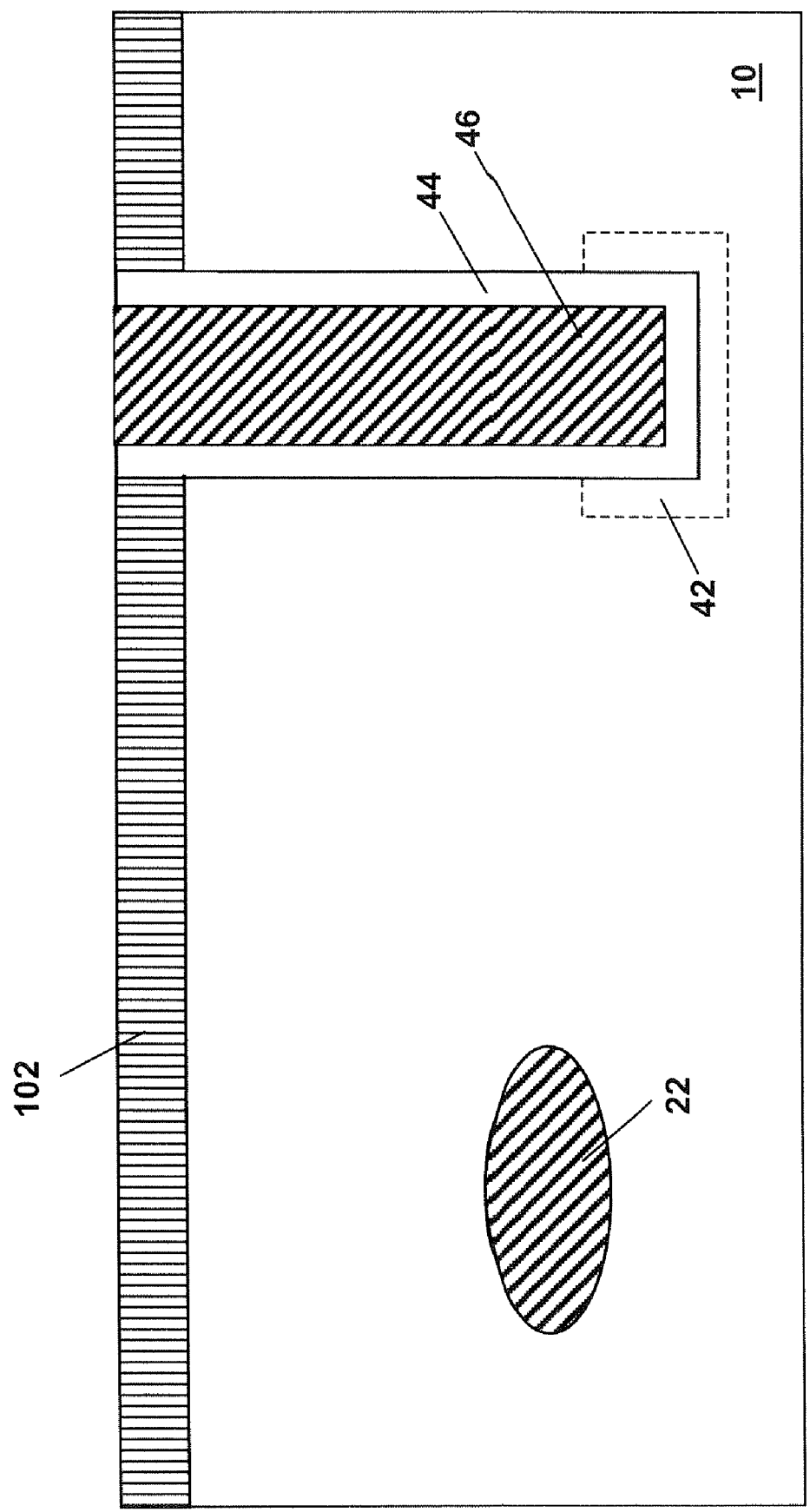

After formation of the node dielectric layer 44, the deep trench 104 is filled with a conductive material or a semiconductor (e.g., doped polysilicon) 46, as shown in FIG. 4E, thereby forming the inner electrode of the trench capacitor 40 in FIG. 1.

Figure 4F:
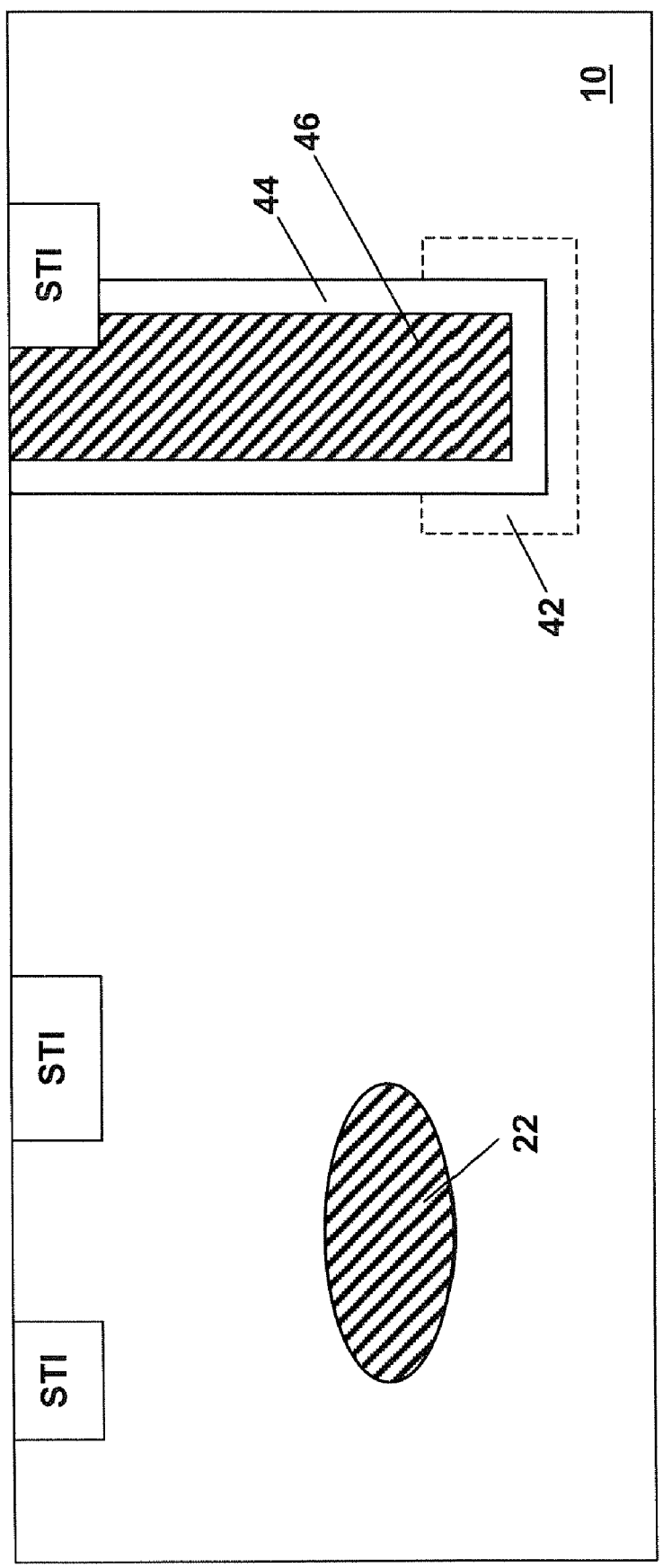

The photoresist block mask 102 can be removed from the surface of the semiconductor substrate 10 by stripping after filling of the deep trench 104, followed by formation of shallow trench isolation regions at both sides of the sub-collector 22 and at one side of the trench fill 46, as shown in FIG. 4F.

Figure 4G:
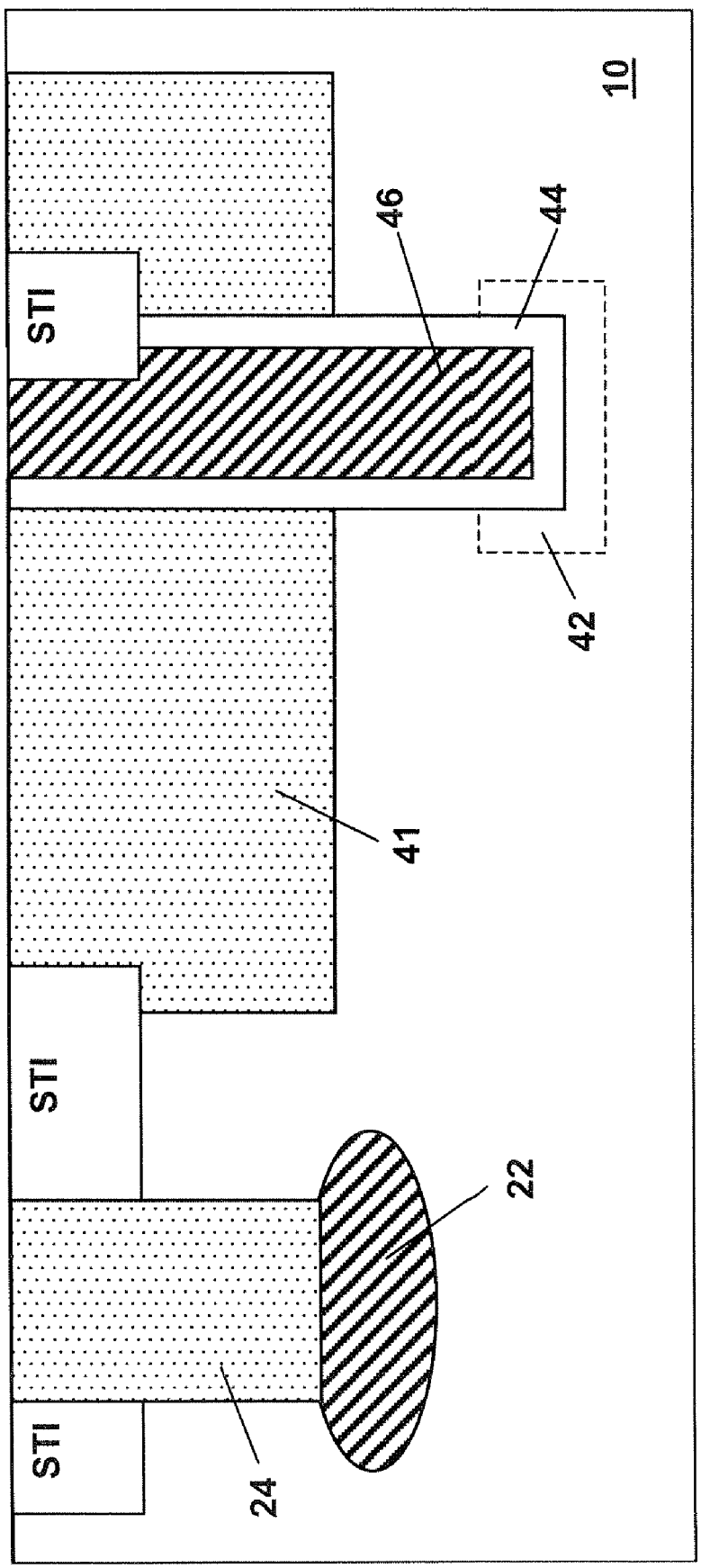

A second ion implantation step is then carried out to simultaneously form the collector 24 for the HBT device and the doped well 41 for the FET of the DRAM cell, as shown in FIG. 4G. The dopant species used in the second ion implantation step must have the same conductivity type as that used in the first ion implantation step, so that the sub-collector 22 and the collector 24 of the HBT device have the same conductivity type. Preferably, both the first and second ion implantation steps use n-type dopant species, so that the HBT device to be formed is a NPN device with n-doped collector and sub-collector 24 and 22, and the DRAM cell to be formed contains a p-channel FET located in an n-well. Alternatively, both the first and second ion implantation steps use p-type dopant species, so that the HBT device to be formed is a PNP device with p-doped collector and sub-collector 24 and 22, and the DRAM cell to be formed contains an n-channel FET located in a p-well.

Figure 4H:
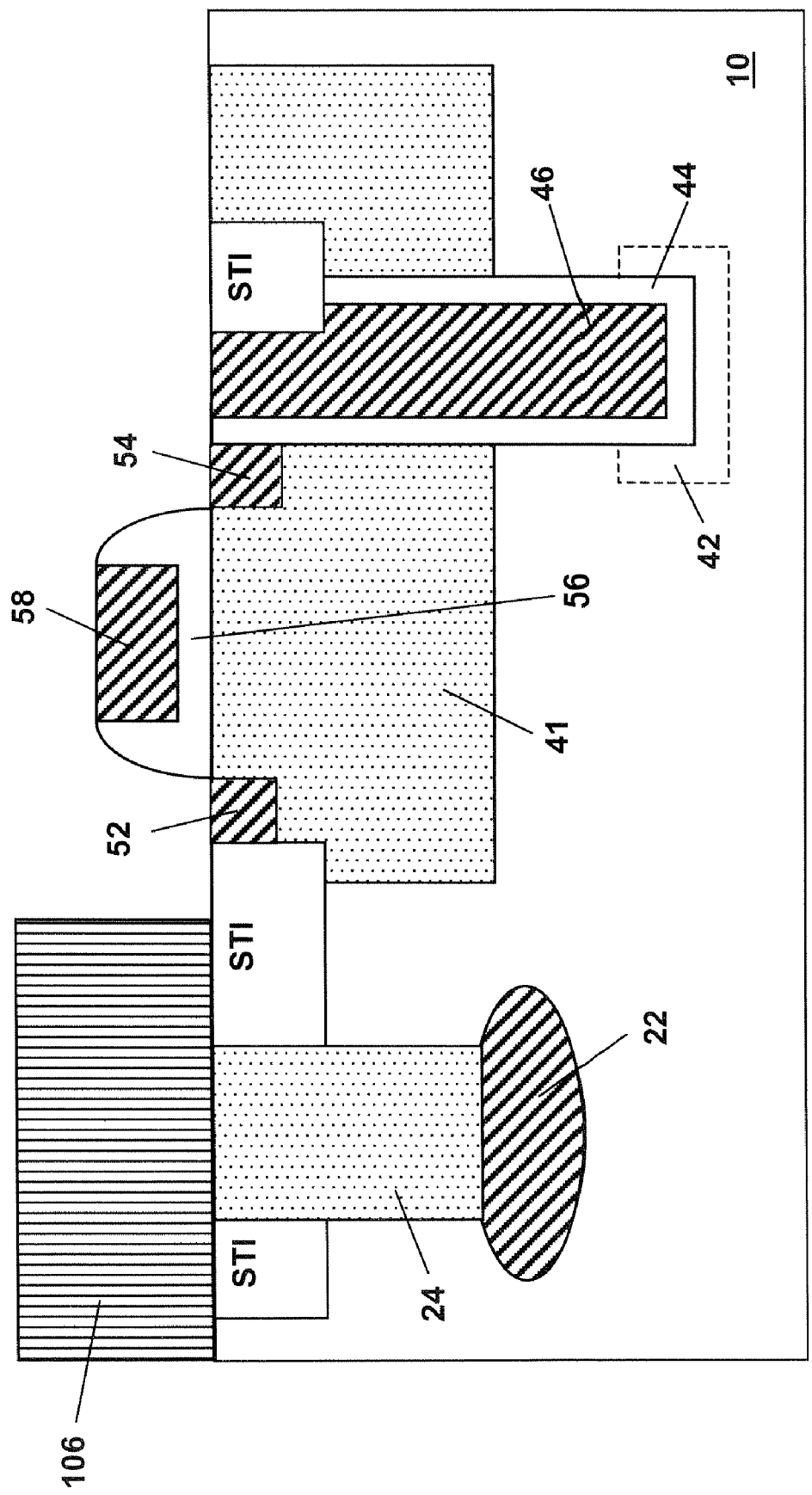

Next, a block mask 106 is formed over the HBT device region to completely cover the collector 24, while conventional CMOS processing steps are carried out at the doped well region 41 to form a FET with a source 52, a drain 54, a gate dielectric 56, and a gate conductor 58, as shown in FIG. 4H. Such CMOS processing steps are well known in the art and are therefore not described in detail here.

Figure 4I:
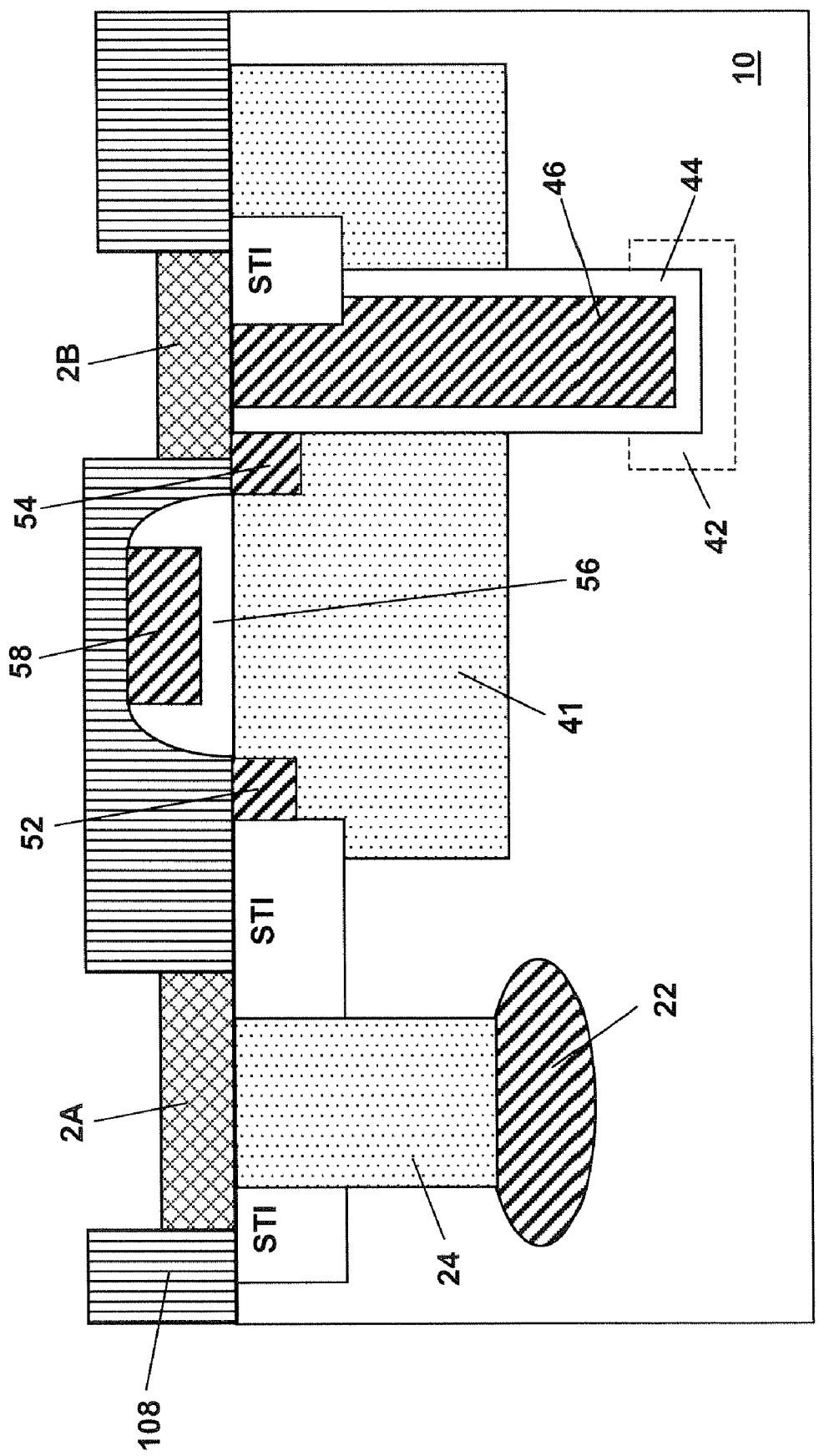

Another pattern mask layer 108 is formed over the entire structure, with a first opening over the collector 24, and a second opening extending over both the trench fill 46 and a portion of the drain 54, as shown in FIG. 4I. In this manner, a SiGe or SiGeC layer can be selectively deposited over the collector 24 and the trench fill 46, while a first portion 2A of the SiGe or SiGeC layer forms the base of the HBT device to be formed, and a second portion 2B of the SiGe or SiGeC layer forms a strap or an interconnect that electrically connects the trench fill 46 and the drain 54 of the DRAM cell to be formed.

The SiGe or SiGeC layer of the present invention may have a flat Ge content profile (i.e., a substantially uniform Ge content is provided across the entire SiGe- or SiGeC-containing layer), a multi-step Ge content profile (i.e., multiple plateaus of uniform Ge content are provided across the entire SiGe- or SiGeC-containing layer), or a graded Ge content profile (i.e., the Ge content changes in the SiGe- or SiGeC-containing layer). The term "Ge content profile" or "germanium content profile" as used herein refers to a plot of germanium contents in a structure as a function of thickness or depth in the structure. Preferably, the SiGe or SiGeC layer of the present invention has a graded Ge content profile, which may have any suitable shape, either regular or irregular. For example, such a SiGe or SiGeC layer may have a triangular Ge content profile, or a trapezoidal Ge content profile.

Preferably, the SiGe or SiGeC layer of the present invention is pseudomorphically grown by chemical vapor deposition (CVD), with well-established process control and proven repeatability and suitable for batch processing and large-scale manufacturing. In addition, CVD process requires no plasma treatment, and the substitutional Ge atoms are electrically inactive, save for minute changes in band structure and ensuring ultra-low contamination levels in the base layers.

The Ge content profile of the SiGe or SiGeC layer can therefore be readily modified or adjusted to offer the possibility of tailoring specific base profiles in both alloy and to dopant and allow pseudomorphic growth of alloys of silicon with germanium for further improvement of the HBT performance.

Figure 4J:
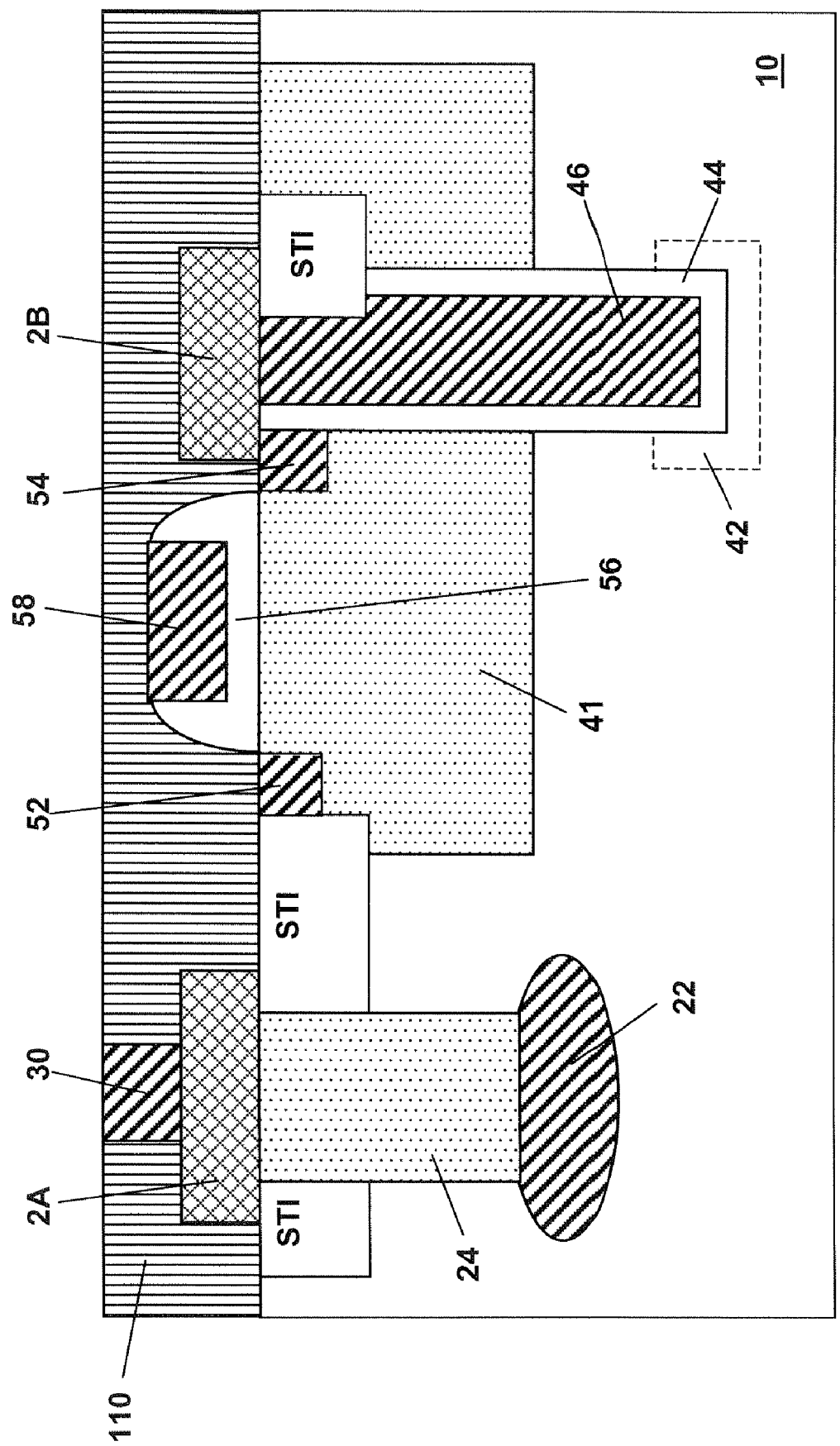

After deposition of the SiGe or SiGeC layer, a further pattern mask layer 110 is formed over the entire structure, with only an opening over the base 2A in the HBT device region, so that an emitter 30 can be formed over the base layer 2A, as shown in FIG. 4J.

Figure 4K:
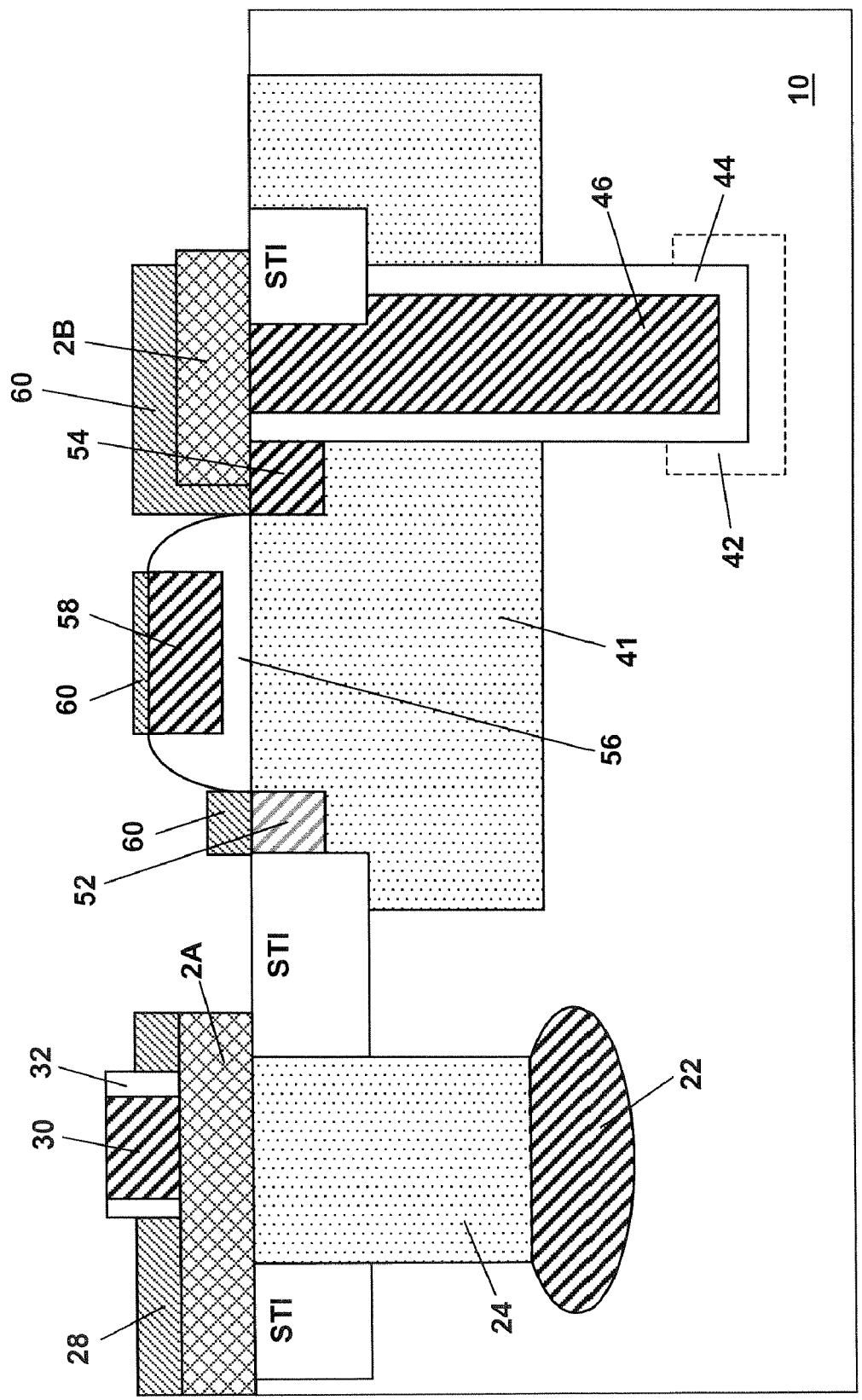

Dielectric spacers 32 can then be formed along the sidewalls of the emitter 30, followed by a salicidation process to form a metal silicide surface contact layer 28 over the HBT base layer 2A and the silicide contacts 60 over the source 52, the drain 54, the gate conductor 58, and the SiGe or SiGeC strap 2B of the DRAM cell, as shown in FIG. 4K.

Finally, an ILD layer 12 can be deposited over the entire structure of FIG. 4K, and conductive plugs 34 and 62 can be formed therein to provide electrical contacts to the HBT device 20 and the DRAM cell 40, as shown in FIG. 1.

FIGS. 5A-5F show the exemplary processing steps of another integrated process for forming the trench-defined HBT and the DRAM cell of FIG. 2, according to one embodiment of the present invention.

Figure 5A:
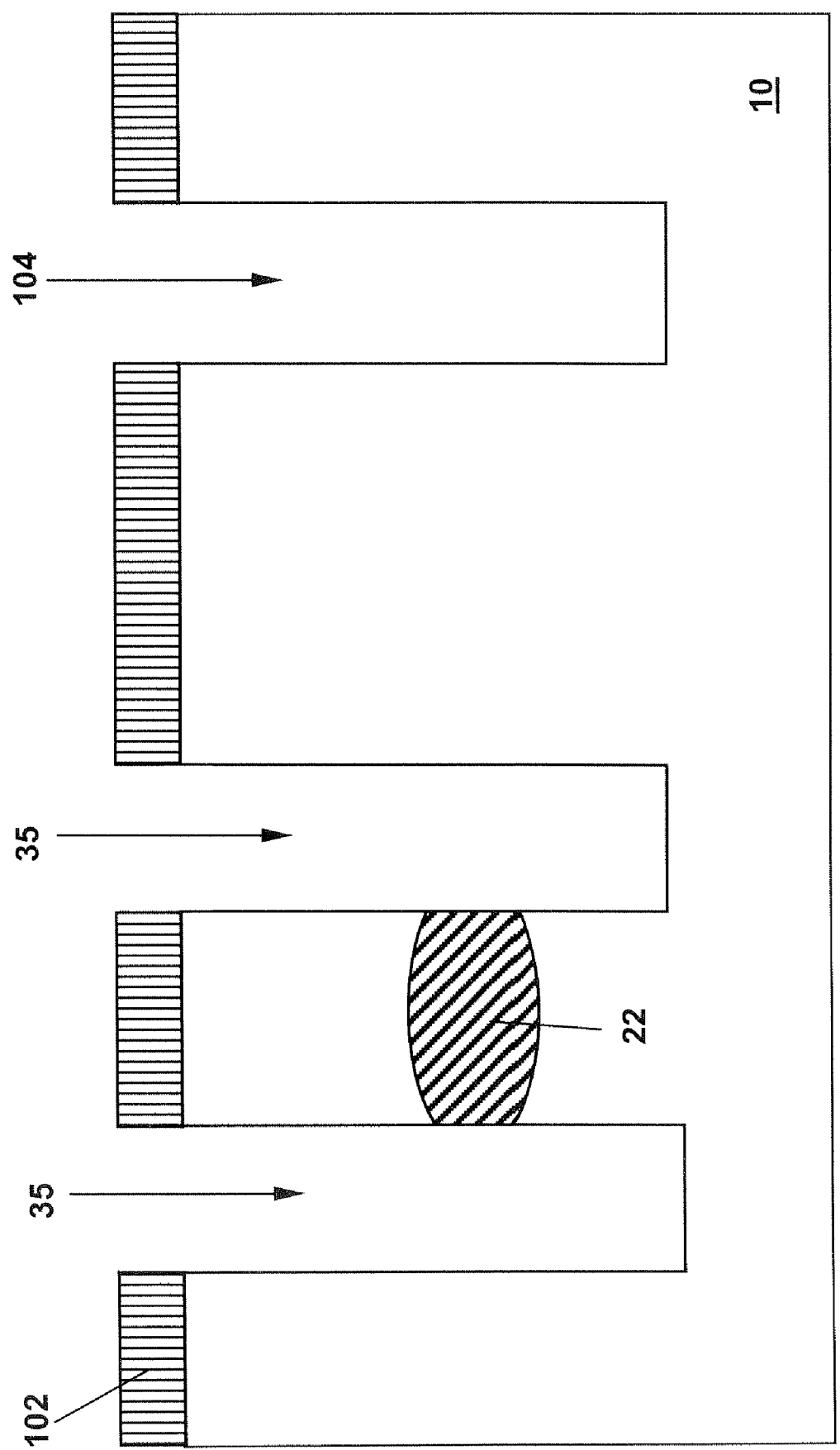
FIGS. 5A-5F show exemplary processing steps for forming the integrated semiconductor device of FIG. 2, according to one embodiment of the present invention.

Specifically, after formation of the buried sub-collector 22 in the extended semiconductor substrate 10 (as shown in FIG. 4B), a photoresist block mask 102 is deposited over the semiconductor substrate 10, followed by trench etching to form a ring-shaped deep trench 35 at the HBT device region and a deep trench 104 at the DRAM cell device region, as shown in FIG. 5A. The ring-shaped deep trench 35 encircles the buried sub-collector 22 and therefore provides a trench definition for the HBT sub-collector 22. As mentioned hereinabove, the trench etching process used in the present invention is preferably, but not necessarily, a plasma-based reactive ion etching (RIE) process or any other dry etching process. The depths of the ring-shaped deep trench 35 and the deep trench 104 preferably range from about 1 µm to about 10 µm, and more preferably from about 1 µm to about 3 µm.

Figure 5B:
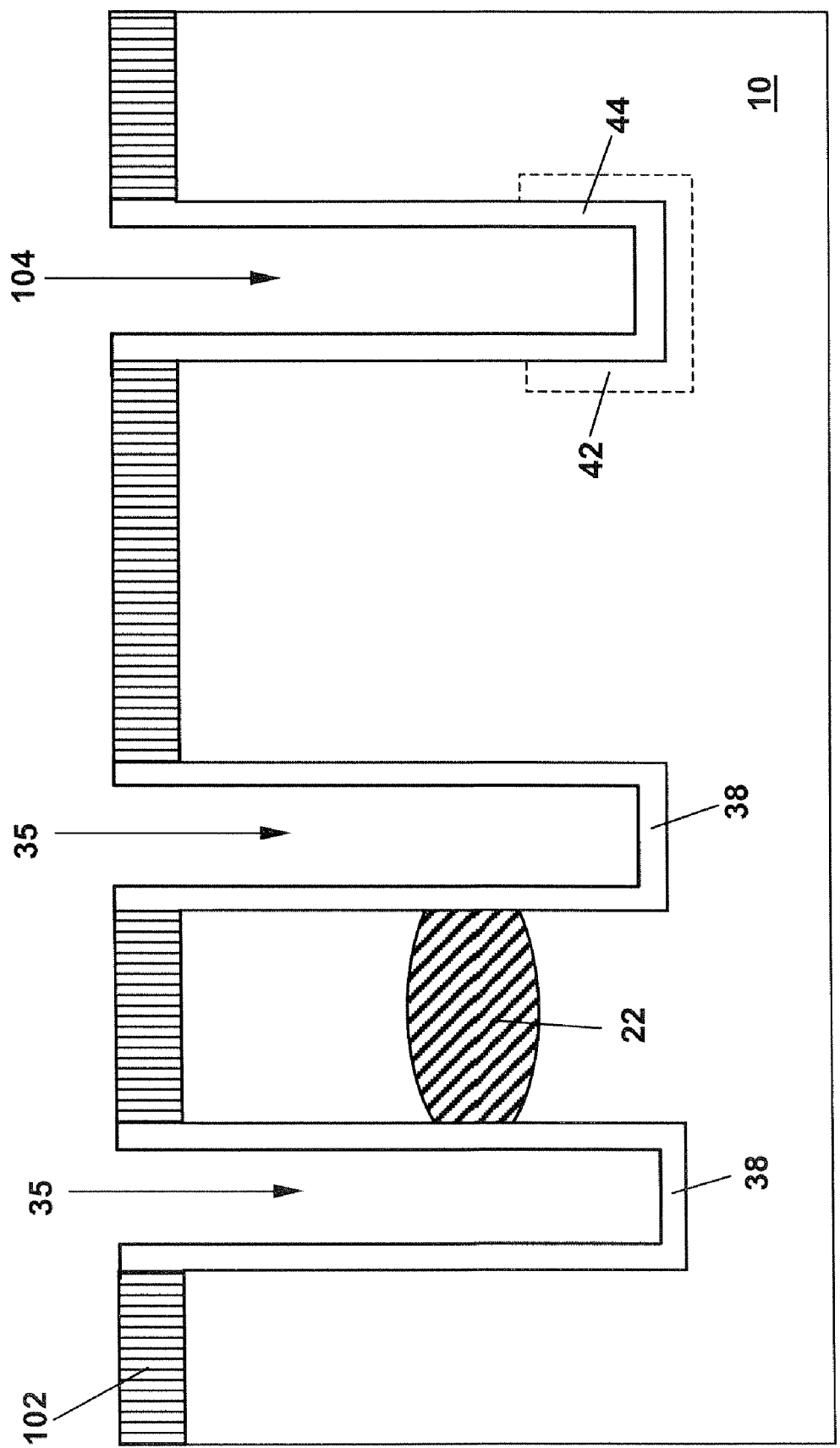

Subsequently, a buried plate 42 (i.e., the outer electrode of the trench capacitor 40 as shown in FIGS. 1 and 2) is formed in the semiconductor substrate 10 at a lower portion of the deep trench 104 by a second ion implantation step, as shown in FIG. 5B. A dielectric deposition step is then carried out to simultaneously form an insulator liner 38 over the interior surface of the ring-shaped deep trench 35 in the HBT device region and a node dielectric layer 44 over the interior surfaces of the deep trench 104 in the DRAM cell device region. The insulator liner 38 and the node dielectric layer 44 may comprise any insulator material, including, but not limited to: silicon oxide, aluminum oxide, hafnium oxide, barium strontium oxide, etc., as mentioned hereinabove. Any suitable dielectric deposition techniques, including, but not limited to: ALD, CVD, and PVD, can be used for depositing the insulator liner 38 and the node dielectric layer 44, and the average thickness of the insulator liner 38 and the node dielectric layer 44 preferably ranges from about 40 Å to about 500 Å.

Figure 5C:
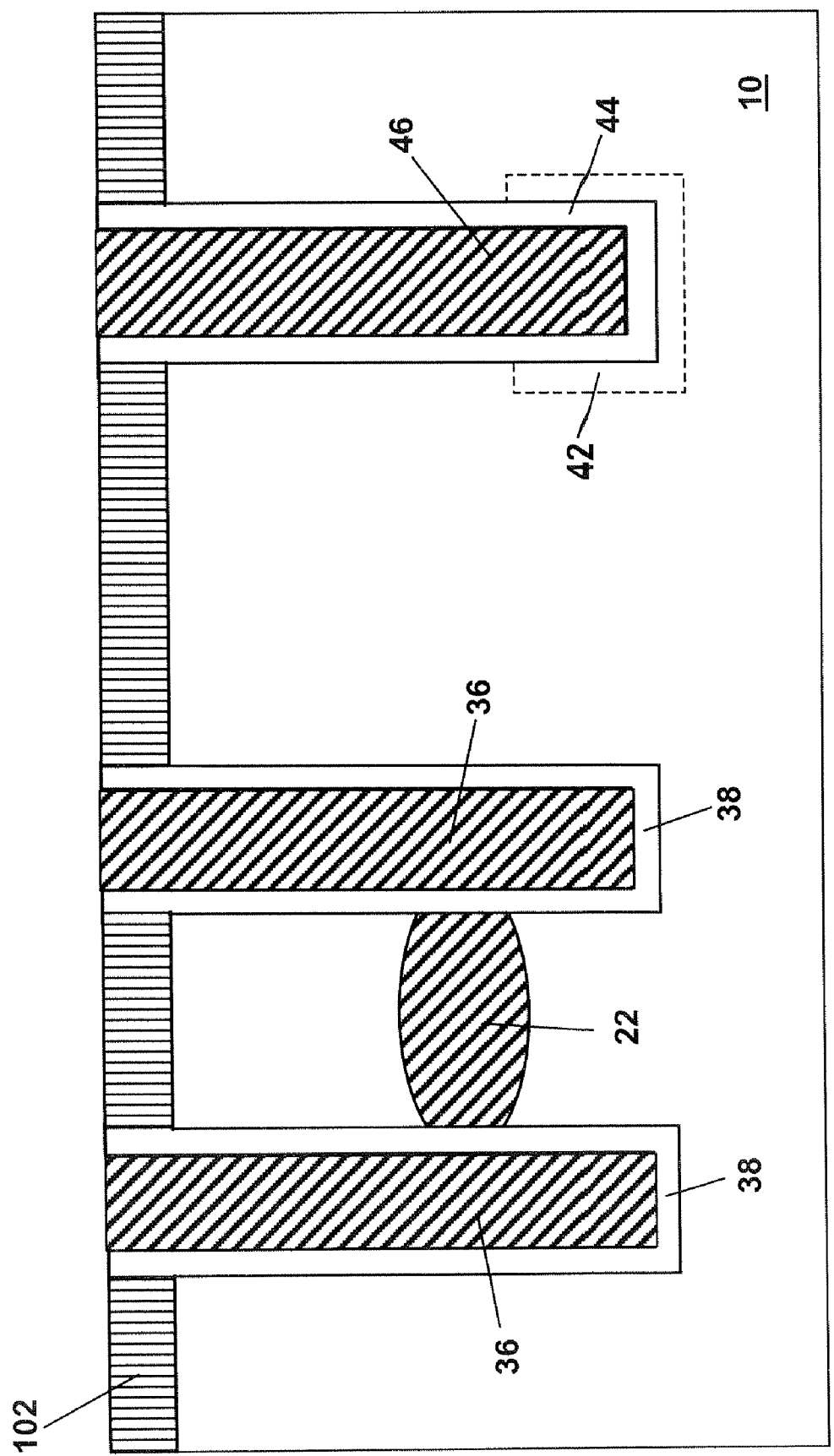

After formation of the insulator liner 38 and the node dielectric layer 44, the ring-shaped deep trench 35 and the deep trench 104 are simultaneously filled with a conductive material or a semiconductor (e.g., doped polysilicon) to form the trench fills 36 and 46, as shown in FIG. 5C.

Figure 5D:
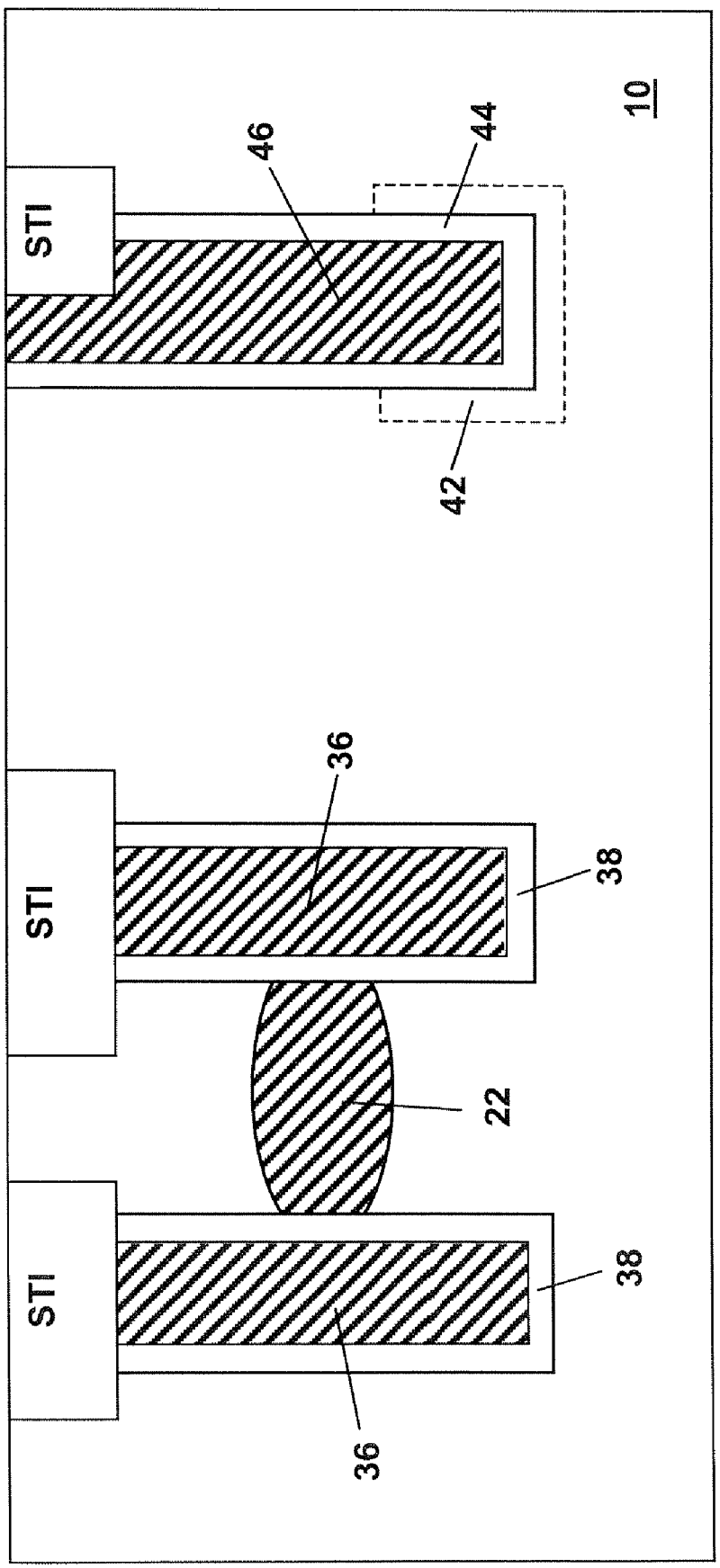

The photoresist block mask 102 can be removed from the surface of the semiconductor substrate 10 by stripping after filling of the ring-shaped deep trench 35 and the deep trench 104, followed by formation of shallow trench isolation regions. On one hand, the ring-shaped deep trench 35 is completely capped by the shallow trench isolation, and the trench fill 36 therefore becomes "floating," with no external electrical contact. On the other hand, the trench fill 46 is only partially covered by the shallow trench isolation at one side thereof, as shown in FIG. 5D.

Figure 5E:
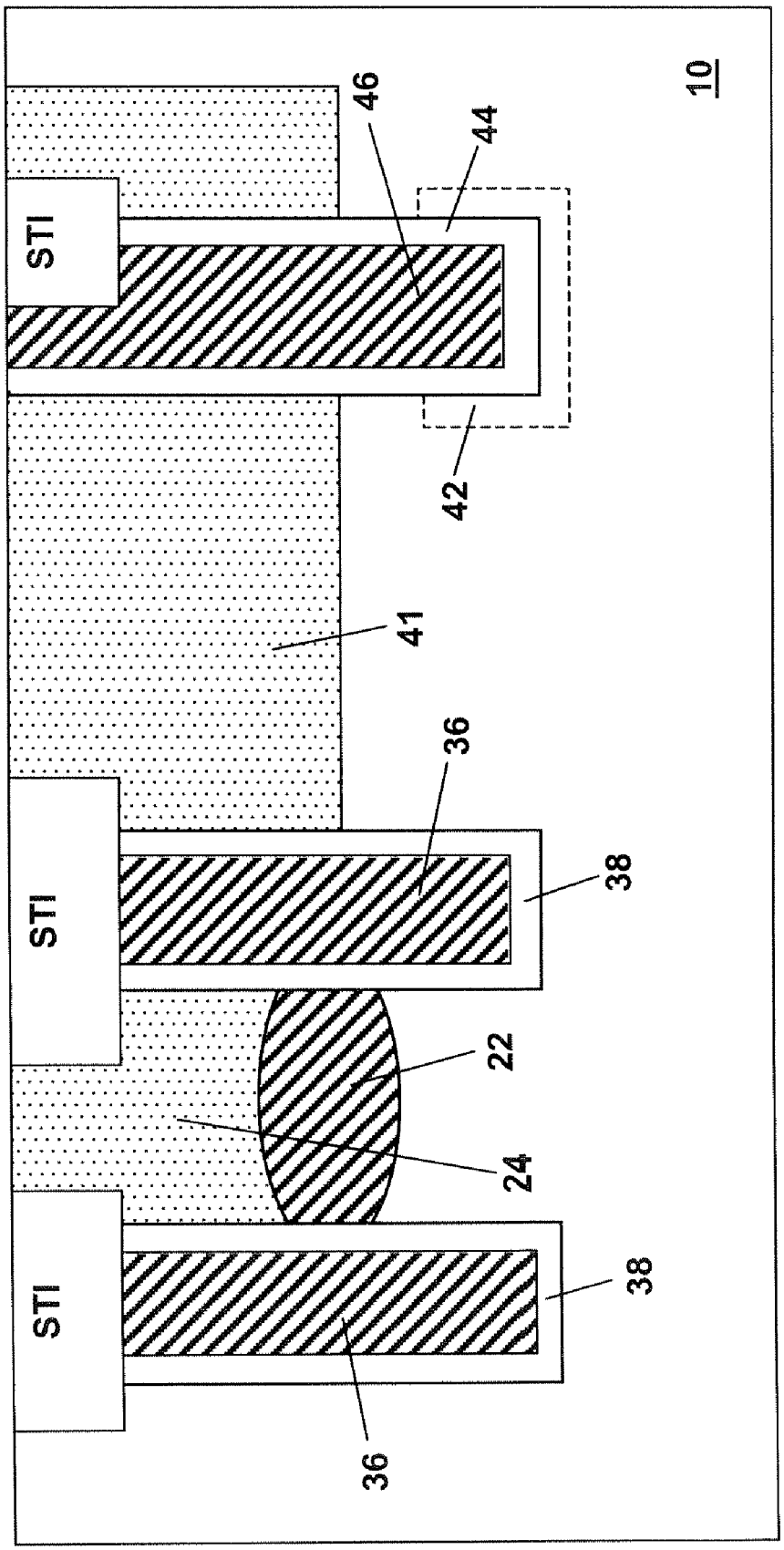

A second ion implantation step is then carried out to simultaneously form the collector 24 for the HBT device and the doped well 41 for the FET of the DRAM cell, as shown in FIG. 5E. The collector 24 is specifically located over the sub-collector 22 and is therefore also encircled by the ring-shaped deep trench 35.

Figure 5F:
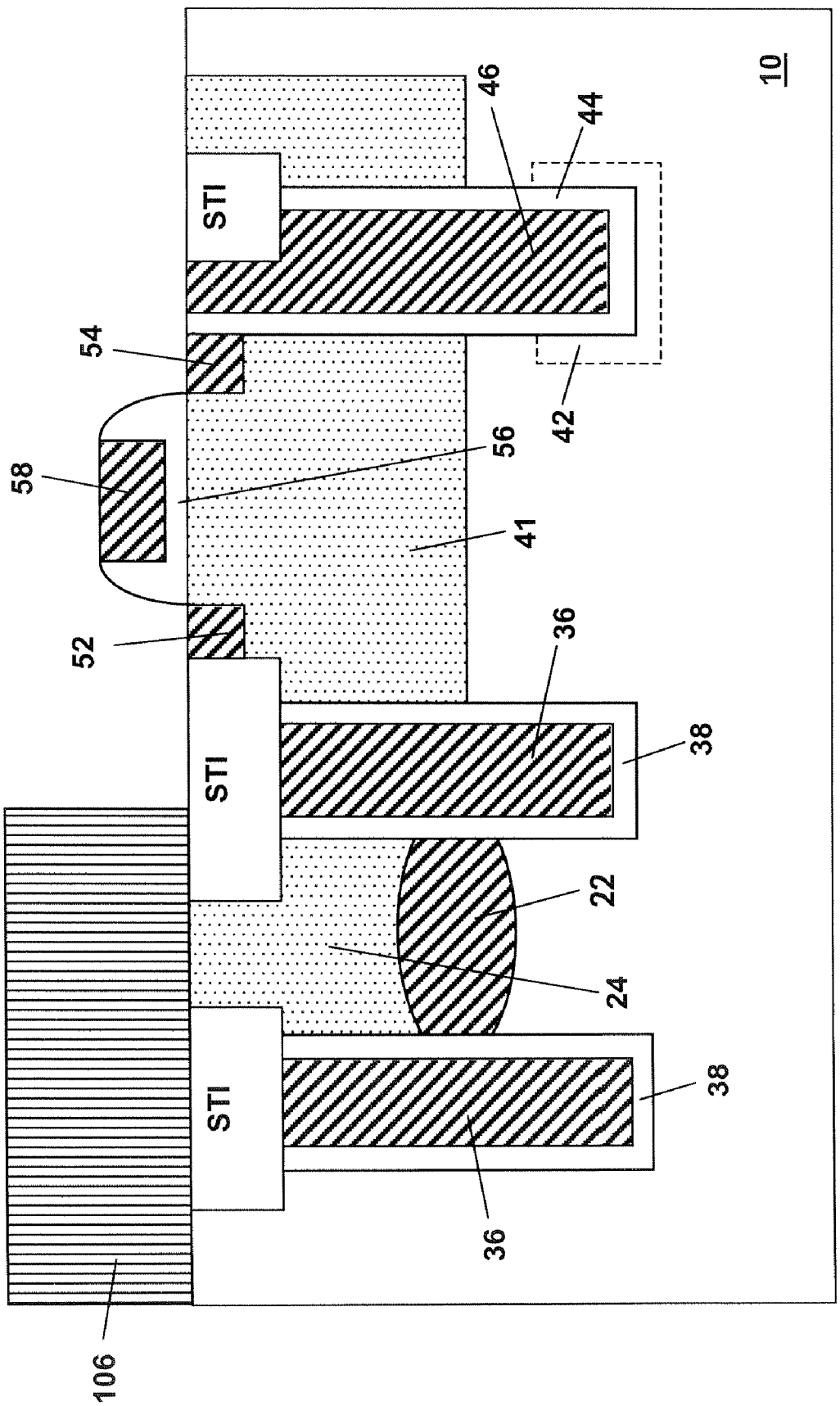

Next, a block mask 106 is formed over the HBT device region to completely cover the collector 24, while conventional CMOS processing steps are carried out at the doped well region 41 to form a FET with a source 52, a drain 54, a gate dielectric 56, and a gate conductor 58, as shown in FIG. 5F. Subsequent processing steps similar to those described hereinabove in FIGS. 4I-4K can be carried out to form the semiconductor device structure as shown in FIG. 2, which contains a HBT device 20 with its sub-collector 22 and collector 24 defined by a ring-shaped deep trench 35.

FIGS. 6A-6I show the exemplary processing steps of yet another integrated process for forming the HBT 20 and the trench-biased PNPN SCR device 70 of FIG. 3, according to one embodiment of the present invention.

First, for formation of a trench-biased PNPN SCR device, the semiconductor substrate 10 must be doped with a p-type dopant species. Alternatively, the semiconductor substrate 10 must be doped with an n-type dopant species, for formation of a trench-biased NPNP SCR device (which is not specifically shown by the drawings but which is contemplated by the present invention).

Figure 6A:
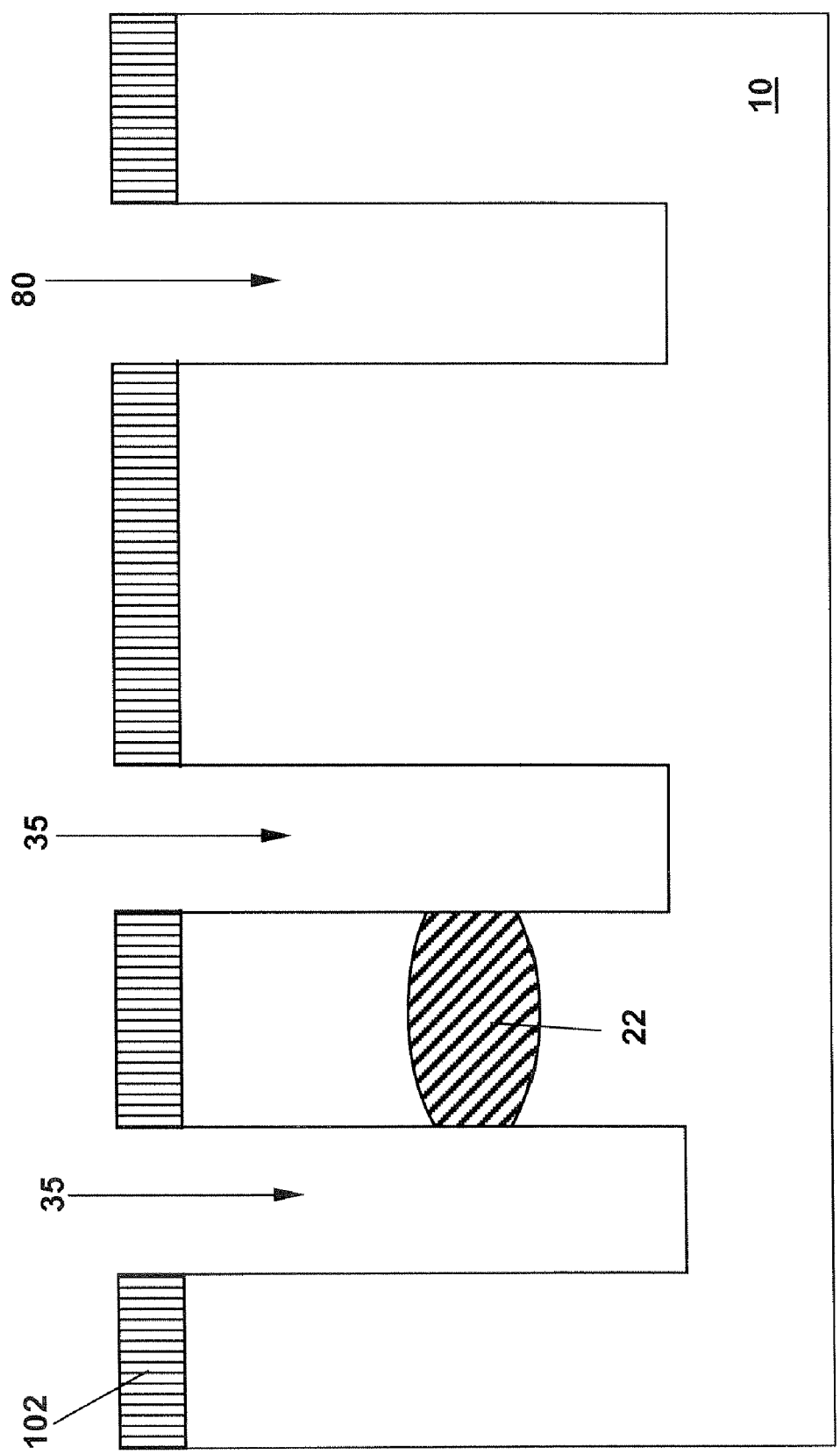
FIGS. 6A-6I show exemplary processing steps for forming the integrated semiconductor device of FIG. 3, according to one embodiment of the present invention.

After formation of the buried sub-collector 22 in the extended semiconductor substrate 10 (as shown in FIG. 4B), a photoresist block mask 102 is deposited over the semiconductor substrate 10, followed by trench etching to form a ring-shaped deep trench 35 at the HBT device region and a deep trench 80 at the trench-biased PNPN device region, as shown in FIG. 6A. As mentioned hereinabove, the trench etching process used in the present invention is preferably, but not necessarily, a plasma-based reactive ion etching (RIE) process or any other dry etching process. The depths of the ring-shaped deep trench 35 and the deep trench 80 preferably range from about 1 µm to about 10 µm, and more preferably from about 1 µm to about 3 µm.

Figure 6B:
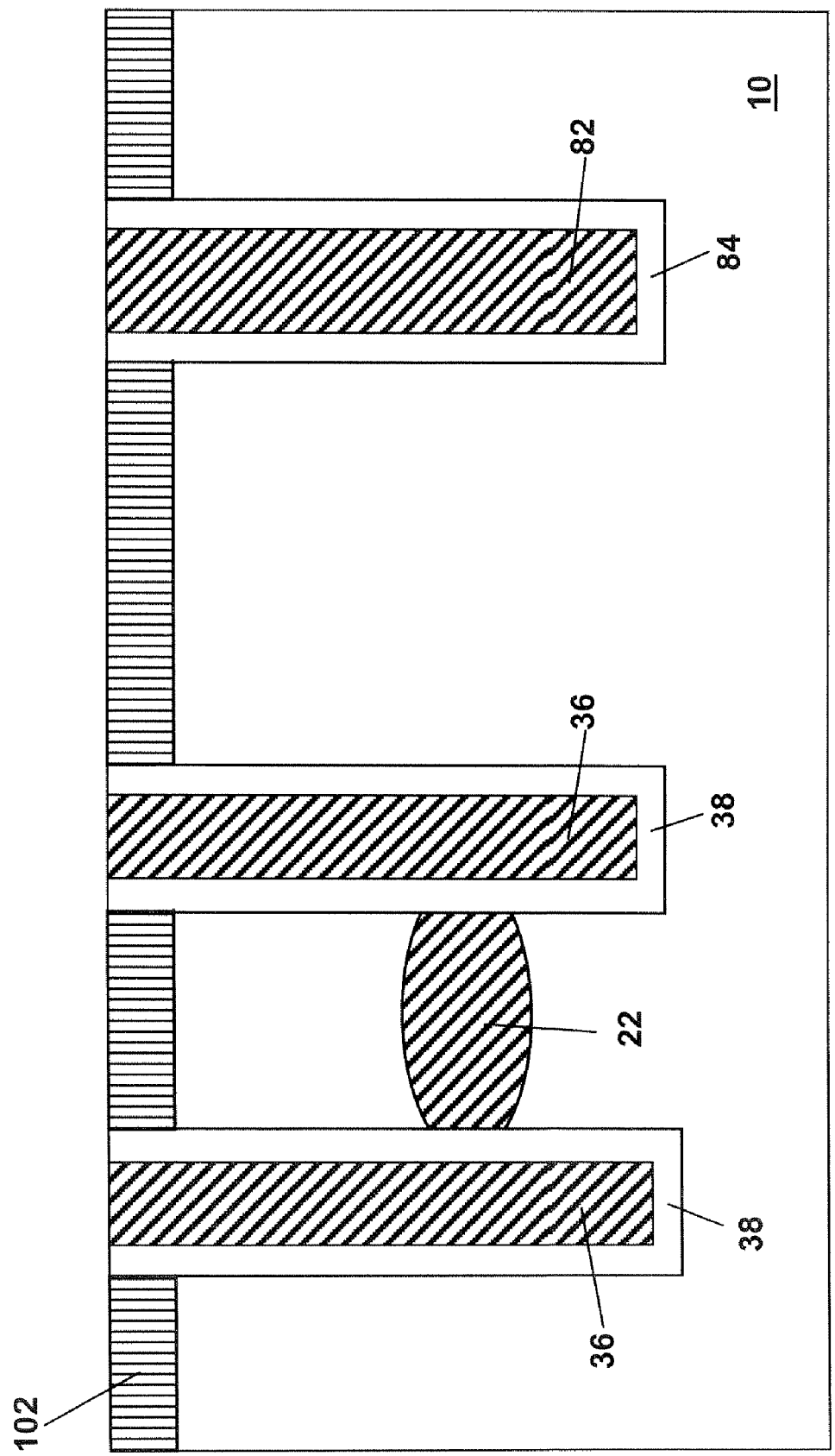

A dielectric deposition step is then carried out to simultaneously form a first insulator liner 38 over the interior surface of the ring-shaped deep trench 35 in the HBT device region and a second insulator liner 84 over the interior surfaces of the deep trench 80 in the trench-biased PNPN device region. The insulator liners 38 and 84 may comprise any insulator material, including, but not limited to: silicon oxide, aluminum oxide, hafnium oxide, barium strontium oxide, etc., as mentioned hereinabove. Any suitable dielectric deposition techniques, including, but not limited to: ALD, CVD, and PVD, can be used for depositing the insulator liners 38 and 84, and the average thickness of the insulator liners 38 and 84 preferably ranges from about 40 Å to about 500 Å. After formation of the insulator liners 38 and 84, the ring-shaped deep trench 35 and the deep trench 80 are simultaneously filled with a conductive material or a semiconductor (e.g., doped polysilicon) to form the trench fills 36 and 82, as shown in FIG. 6B.

Figure 6C:
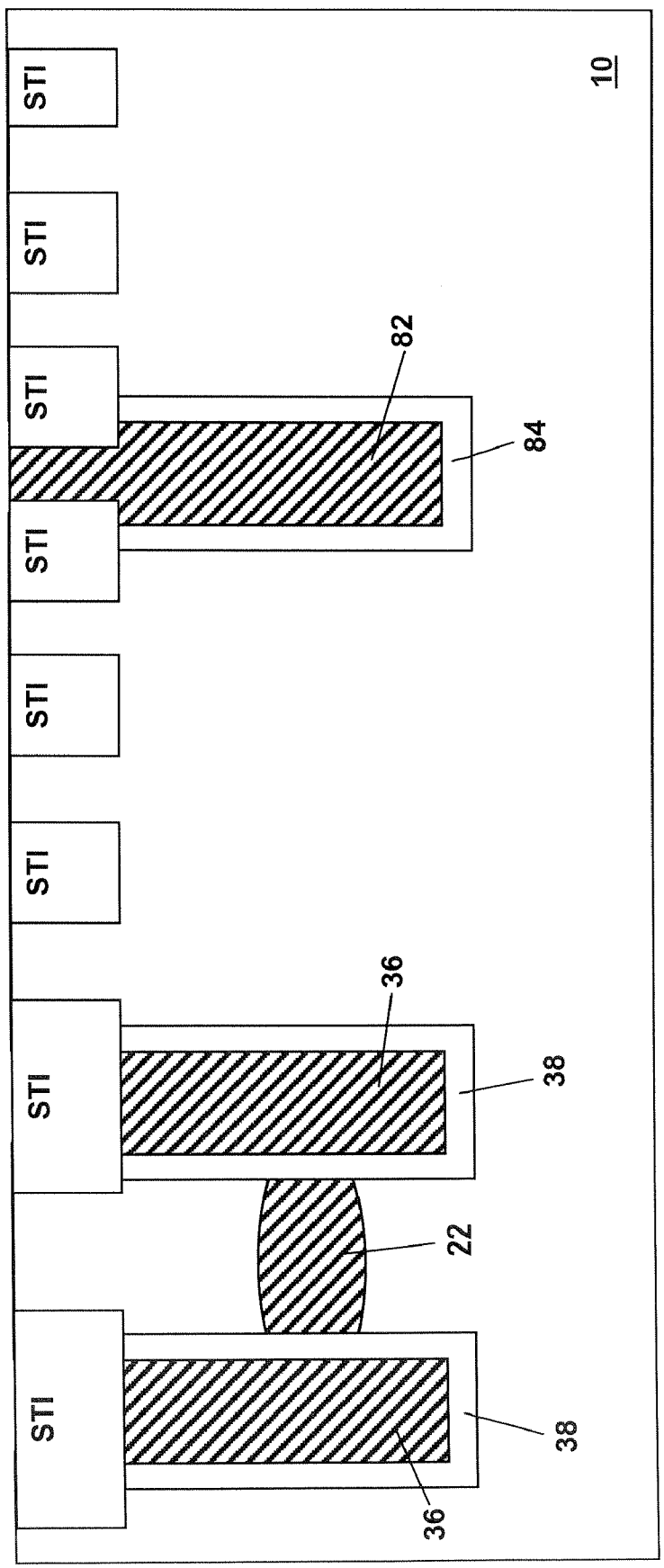

The photoresist block mask 102 can be removed from the surface of the semiconductor substrate 10 by stripping after filling of the ring-shaped deep trench 35 and the deep trench 80, followed by formation of shallow trench isolation regions, as shown in FIG. 6C. On one hand, the ring-shaped deep trench 35 is completely capped by the shallow trench isolation, and the trench fill 36 therefore becomes "floating," with no external electrical contact. On the other hand, the trench fill 82 is only partially covered by shallow trench isolations located at both side thereof, but with a middle section exposed on the substrate surface, as shown in FIG. 6C.

Figure 6D:
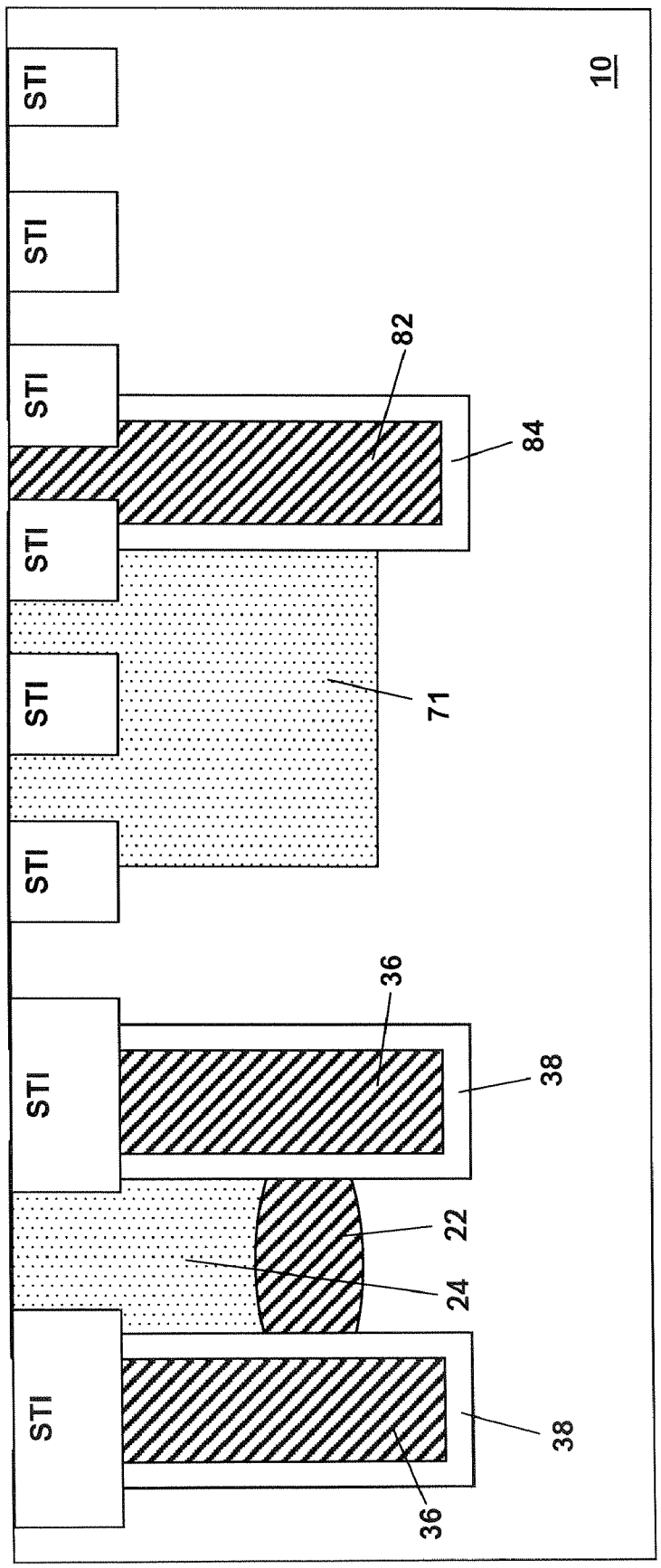

A second ion implantation step is then carried out to simultaneously form the collector 24 for the HBT device and the doped well 71 for the trench-biased SCR device, as shown in FIG. 6D. The collector 24 is specifically located over the sub-collector 22 and is therefore also encircled by the ring-shaped deep trench 35. The dopant species used in the second ion implantation step must have the same conductivity type as that used in the first ion implantation step, so that the sub-collector 22 and the collector 24 of the HBT device have the same conductivity type. Preferably, both the first and second ion implantation steps use n-type dopant species, so that the HBT device to be formed is a NPN device with n-doped collector and sub-collector 24 and 22, and the doped well region 71 is an n-well over which a PNPN SCR device can be formed. Alternatively, both the first and second ion implantation steps use p-type dopant species, so that the HBT device to be formed is a PNP device with p-doped collector and sub-collector 24 and 22, and the doped well region 71 can be a p-well over which an NPNP SCR device can be formed.

Figure 6E:
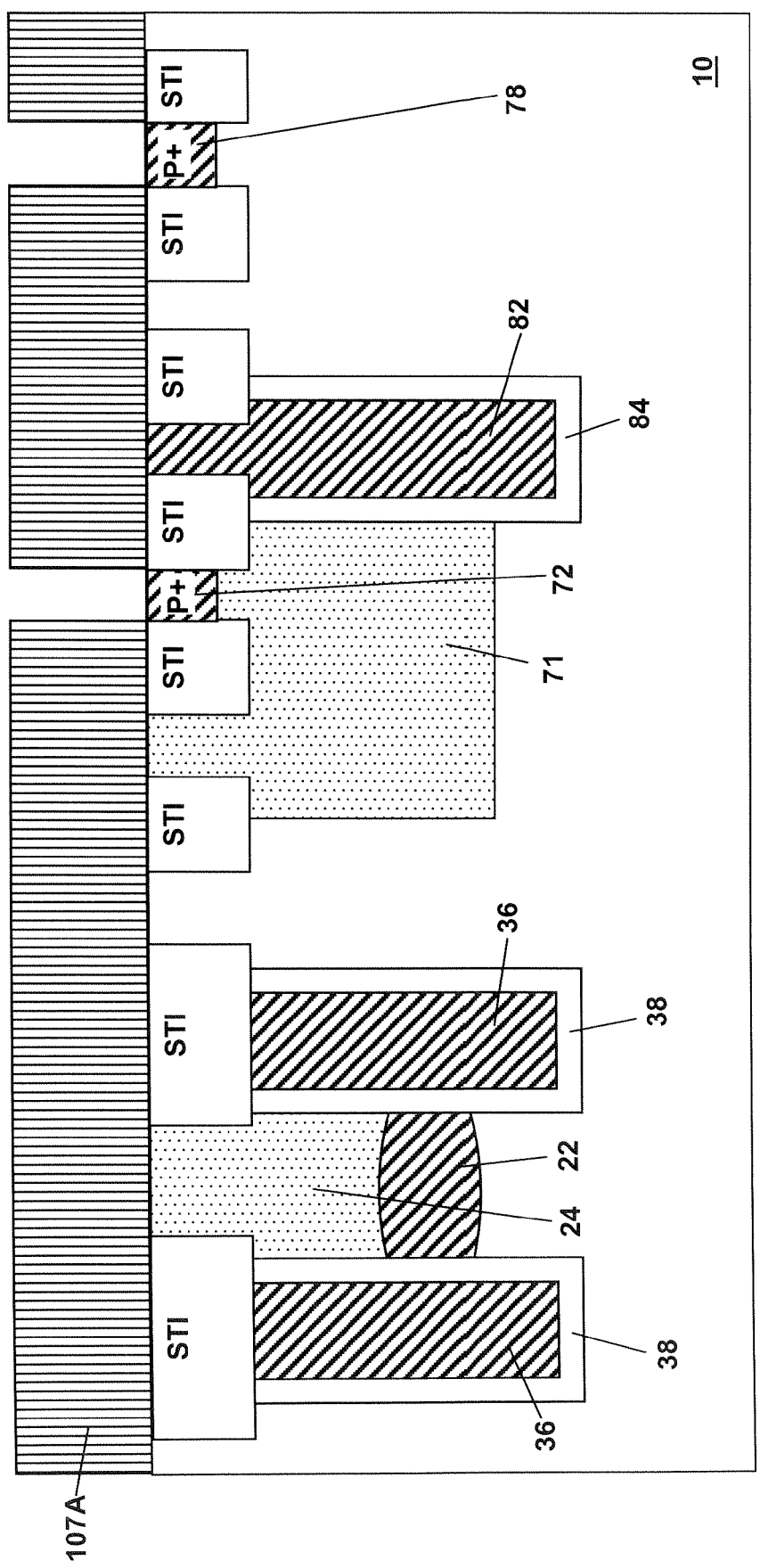

Next, a patterned mask 107A is formed over the entire structure, with the exception that two openings are provided over a first portion of the n-well 71 and a first portion of the p-doped semiconductor substrate 10. A conventional CMOS processing step typically used for forming source/drain implants for p-channel FETs is then selectively carried out over the two openings to form a p-type anode 72 over the first portion of the n-well 71 and a p-doped substrate contact layer 78 (optional) over the first portion of the p-doped semiconductor substrate 10, as shown in FIG. 6E. The patterned mask 107A is removed from the substrate surface after formation of the p-type anode 72 and the p-doped substrate contact layer 78.

Figure 6F:
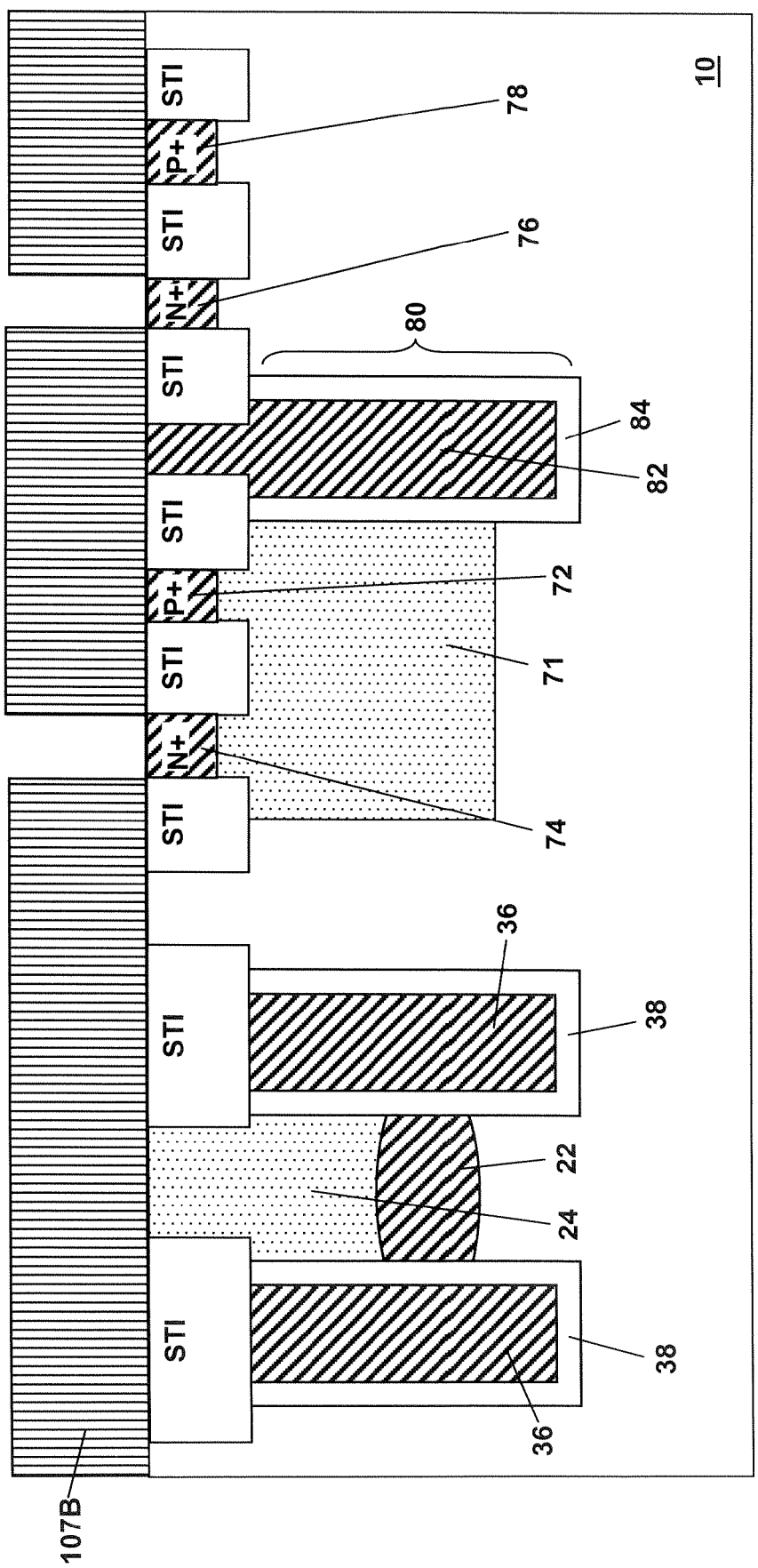

Another patterned mask 107B is then formed over the entire structure, with the exception that two openings are provided over a second, different portion of the n-well 71 and a second, different portion of the p-doped semiconductor substrate 10. Another conventional CMOS processing step typically used for forming source/drain implants for n-channel FETs is selectively carried out over the two openings to form an n-doped well contact layer 74 (optional) over the second portion of the n-well 71 and an n-type anode 76 over the second portion of the p-doped semiconductor substrate 10, as shown in FIG. 6F. The patterned mask 107B is removed from the substrate surface after formation of the n-doped well contact layer 74 and the n-type anode 76.

Note that the p-type anode 72, the n-type cathode 76, the optional n-doped well contact layer 74, and the optional p-doped substrate contact layer 78 are all spaced apart and isolated from the opening of the deep trench 80, as well as from one another, by shallow trench isolations, as shown in FIG. 6F.

Figure 6G:
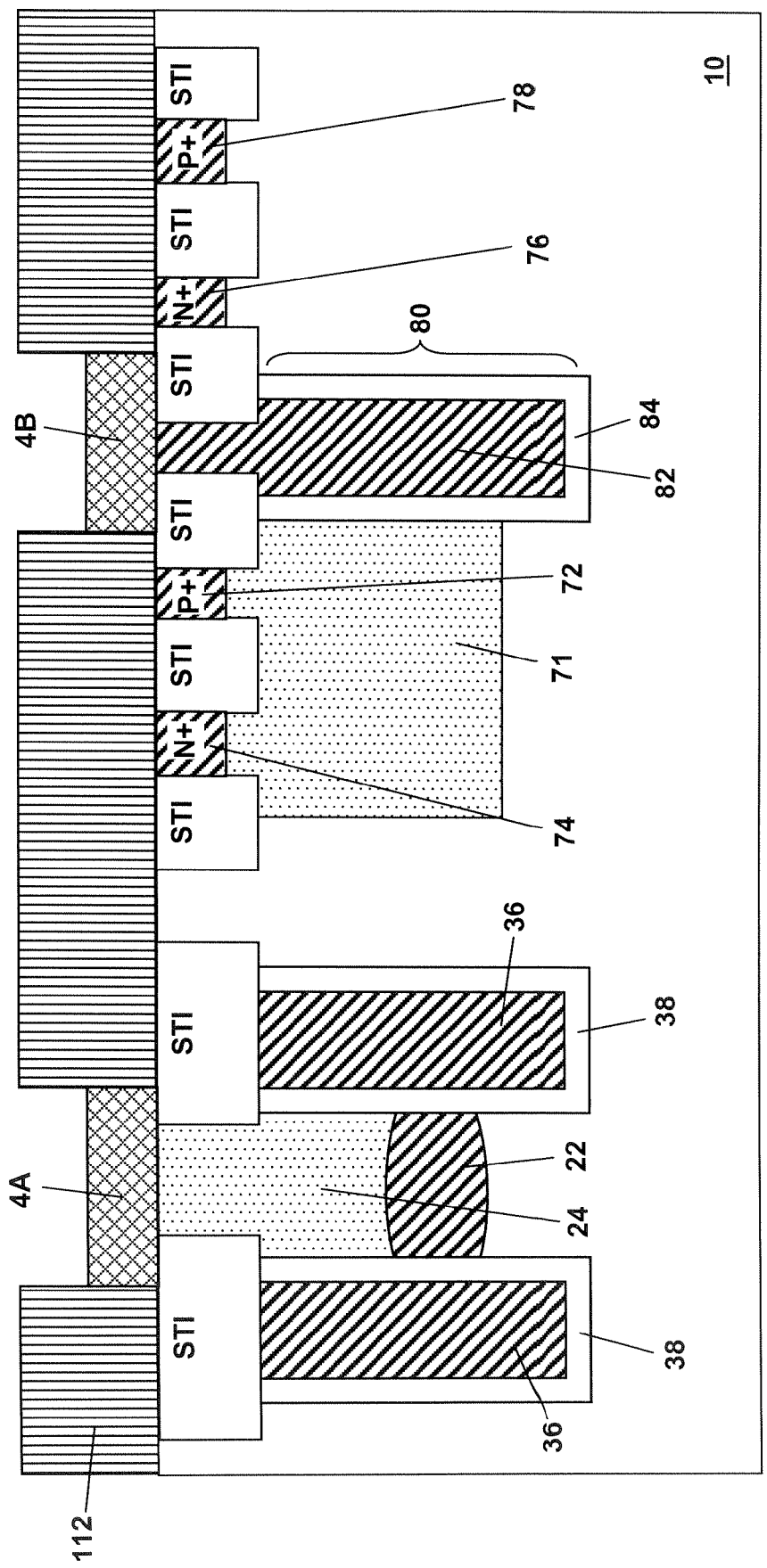

Yet another pattern mask layer 112 is formed over the entire structure, with a first opening over the collector 24, and a second opening over both the trench fill 82, as shown in FIG. 6G. In this manner, a SiGe or SiGeC layer can be selectively deposited over the collector 24 and the trench fill 82, while a first portion 4A of the SiGe or SiGeC layer forms the base of the HBT device to be formed, and a second portion 4B of the SiGe or SiGeC layer forms a conductive contact for the deep trench 80 of the trench-biased PNPN device to be formed.

Figure 6H:
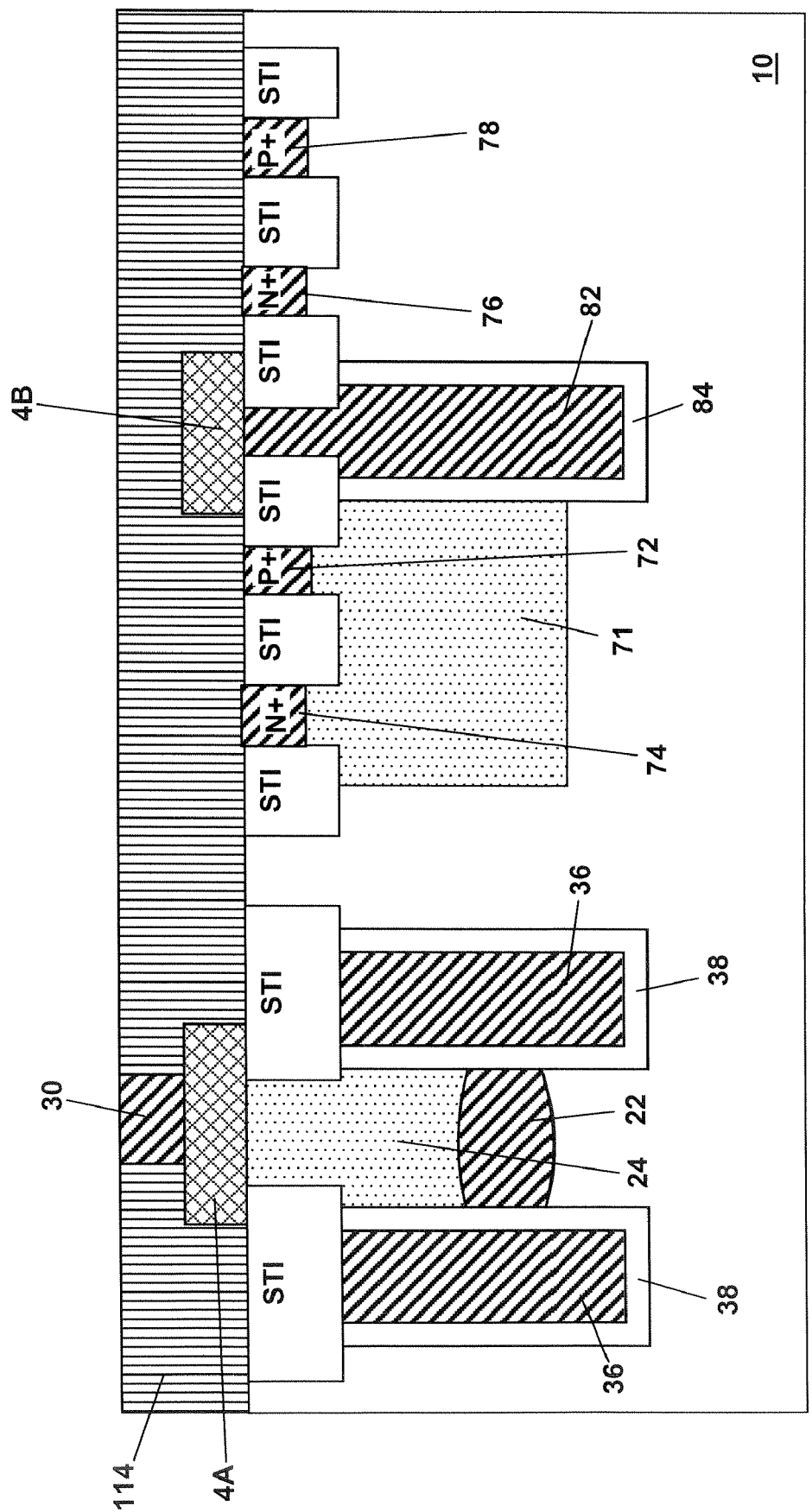

After deposition of the SiGe or SiGeC layer, a further pattern mask layer 114 is formed over the entire structure, with only an opening over the base 4A in the HBT device region, so that emitter 30 can be formed over the base layer 4A, as shown in FIG. 6H.

Figure 6I:
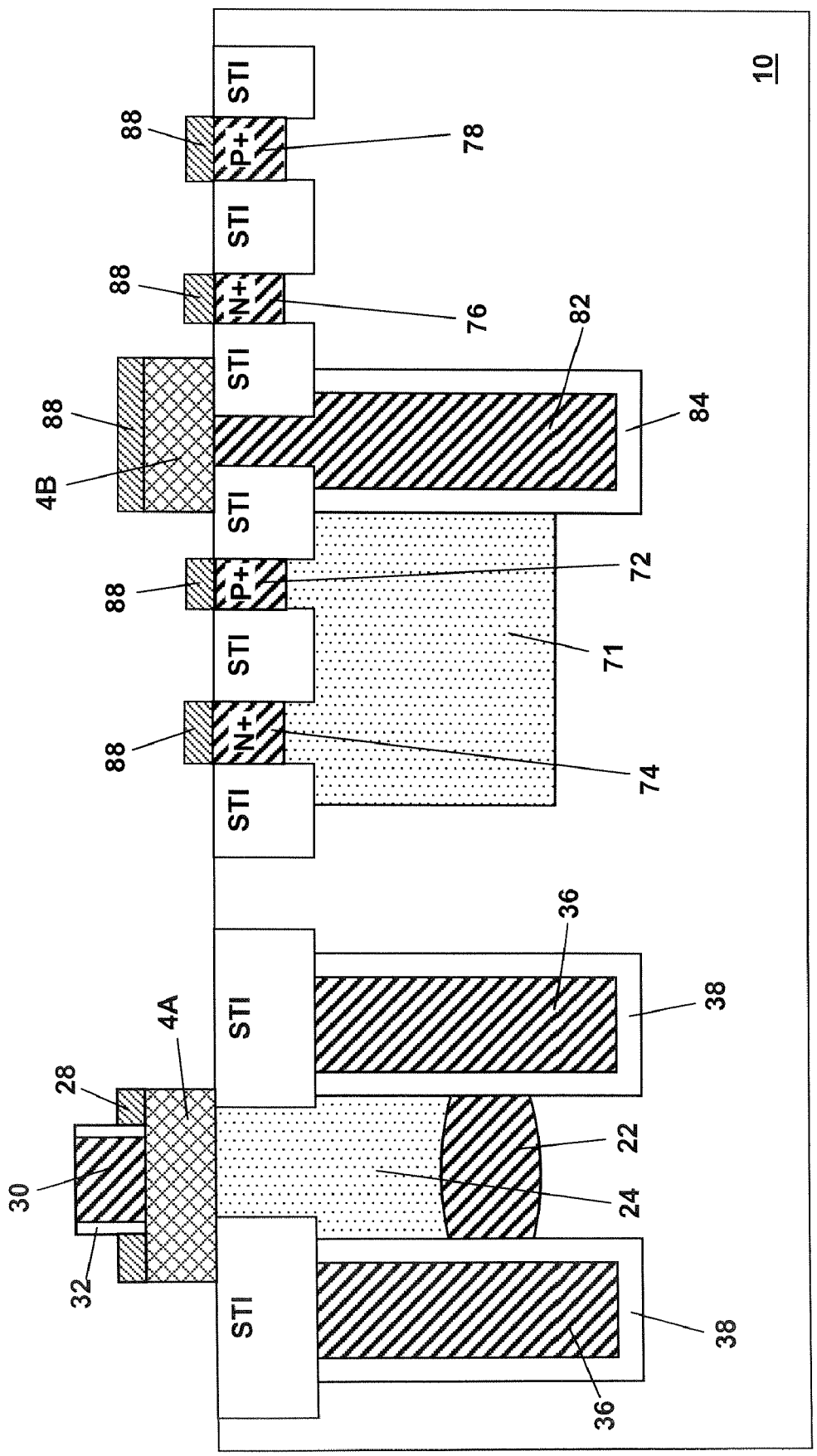

Dielectric spacers 32 can then be formed along the sidewalls of the emitter 30, followed by a salicidation process to form a metal silicide surface contact layer 28 over the HBT base layer 2A and the silicide contacts 88 over the p-type anode 72, the n-doped well contact layer 74, the n-type cathode, and the p-doped substrate contact layer 78 of the trench-biased PNPN device, as shown in FIG. 6I.

Finally, an ILD layer 12 can be deposited over the entire structure of FIG. 6I, and conductive plugs 34 and 89 can be formed therein to provide electrical contacts to the HBT device 20 and the trench-biased PNPN device 70, as shown in FIG. 3.

While FIGS. 1-6I illustratively demonstrates several exemplary semiconductor device structures and exemplary processing steps according to a specific embodiment of the present invention, it is clear that a person ordinarily skilled in the art can readily modify such process steps as well as device structures so formed for adaptation to specific application requirements, consistent with the above descriptions. For example, while the DRAM cell and the trench-biased PNPN SCR device are illustrated as exemplary semiconductor devices that can be integrated with the SiGe- or SiGeC-based HBT device, it is clear that a person ordinarily skilled in the art can readily replace such DRAM cell and the trench-biased PNPN SCR device with other suitable semiconductor devices, such as, for example, diodes, transistors, capacitors, resistors, etc. Further, the DRAM cell and the trench-biased PNPN SCR device of the present invention can also be readily used in other applications where HBT devices are not necessary.

It is also important to note that the trench-biased SCR device as described hereinabove is a novel SCR device structure. More importantly, such a trench-biased SCR device structure can achieve multiple trigger state conditions by application of a positive trench bias voltage, and it is particularly suitable for applications that require multiple trigger conditions.

Figure 7A:
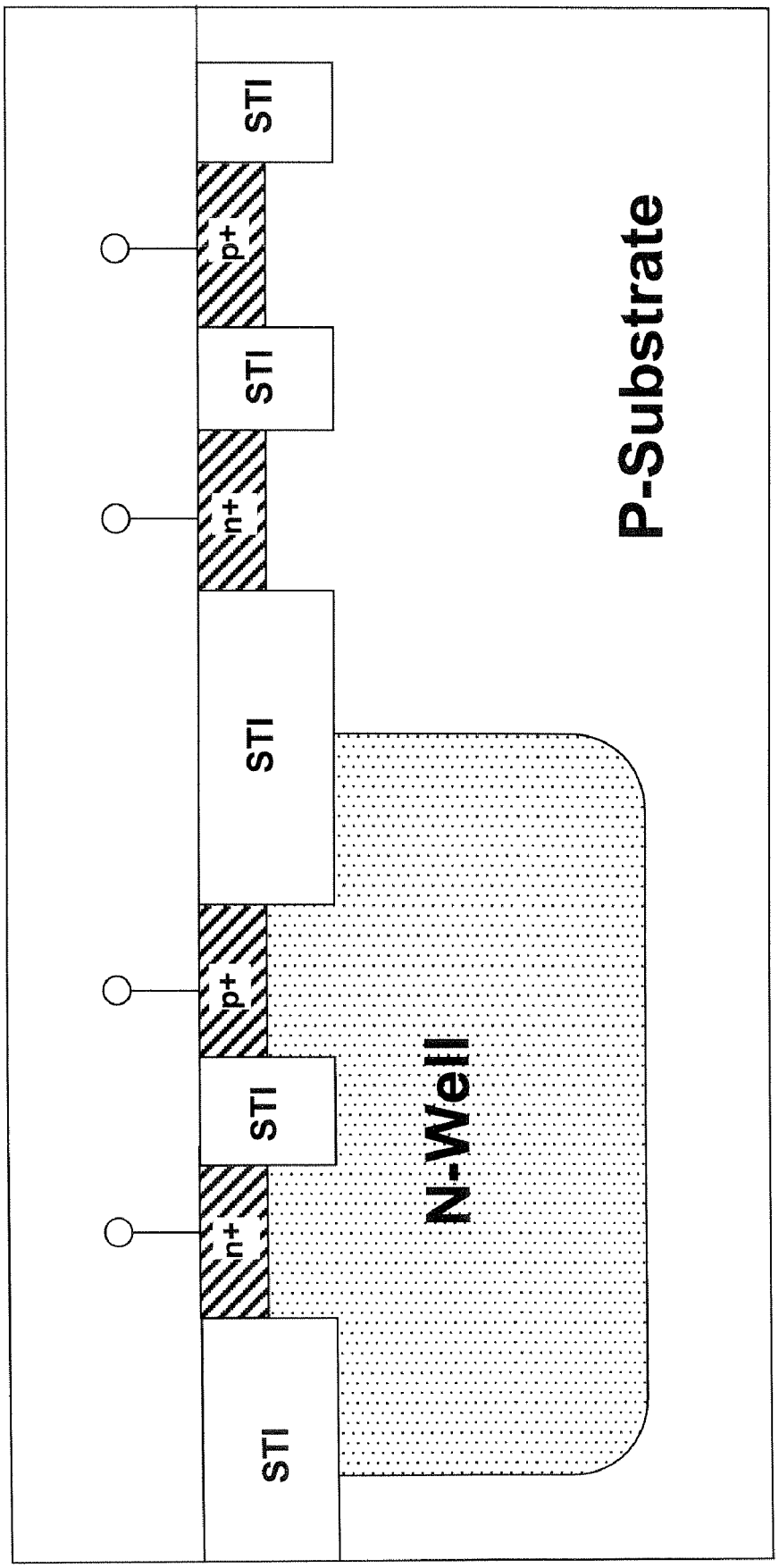
FIGS. 7A-7B are cross-sectional and top views of a conventional PNPN SCR device.
Figure 7B:
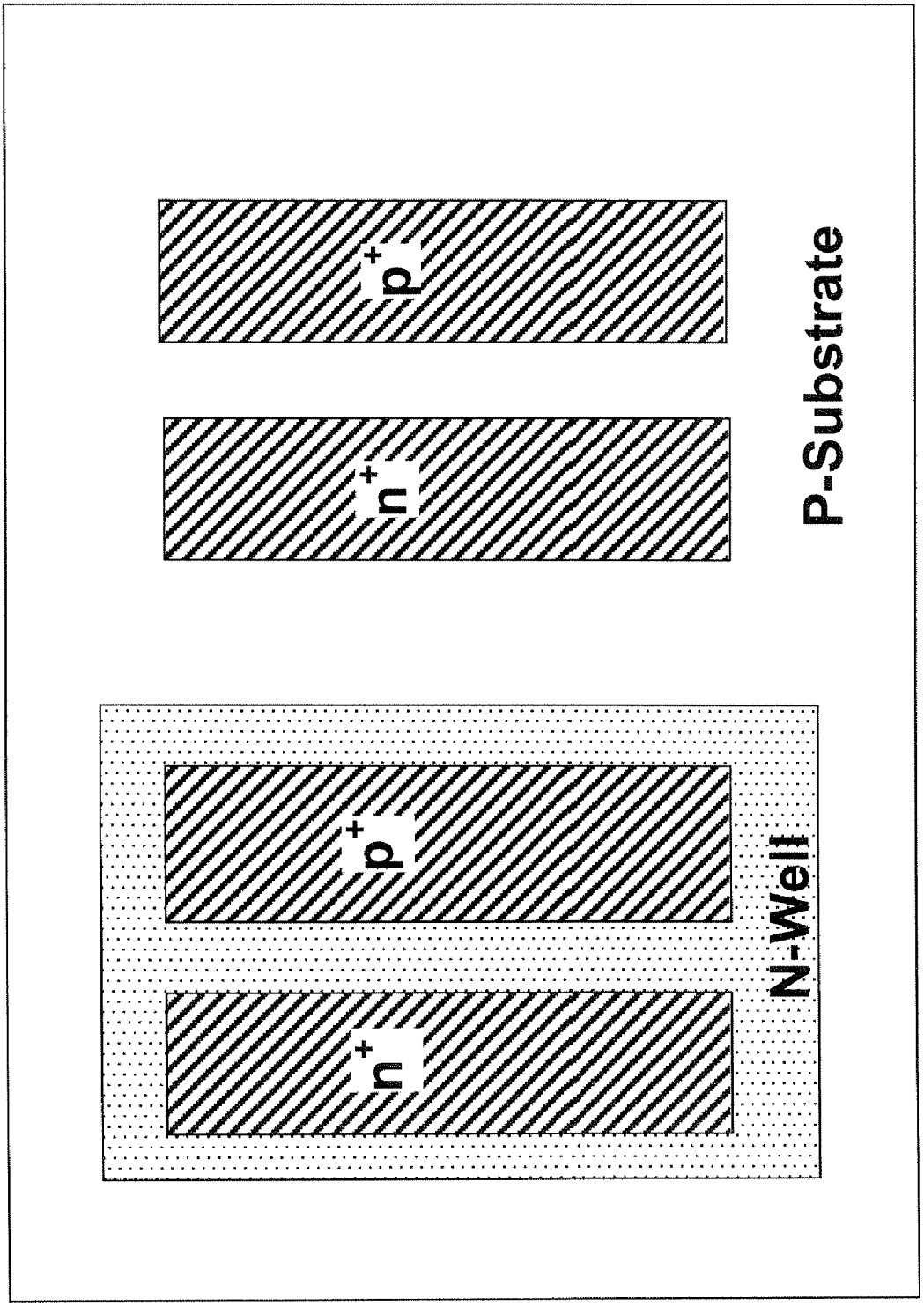

A conventional PNPN SCR device comprises a p-type anode located over a n-well, which is in turn located over a p-doped substrate, and an n-type cathode located over the p-doped substrate in a spaced apart relationship with the n-well, as shown in FIGS. 7A and 7B. Optional surface contact layers can be provided for the n-well and the p-doped substrate, which are correspondingly doped with n-type and p-type dopant species.

Figure 8:
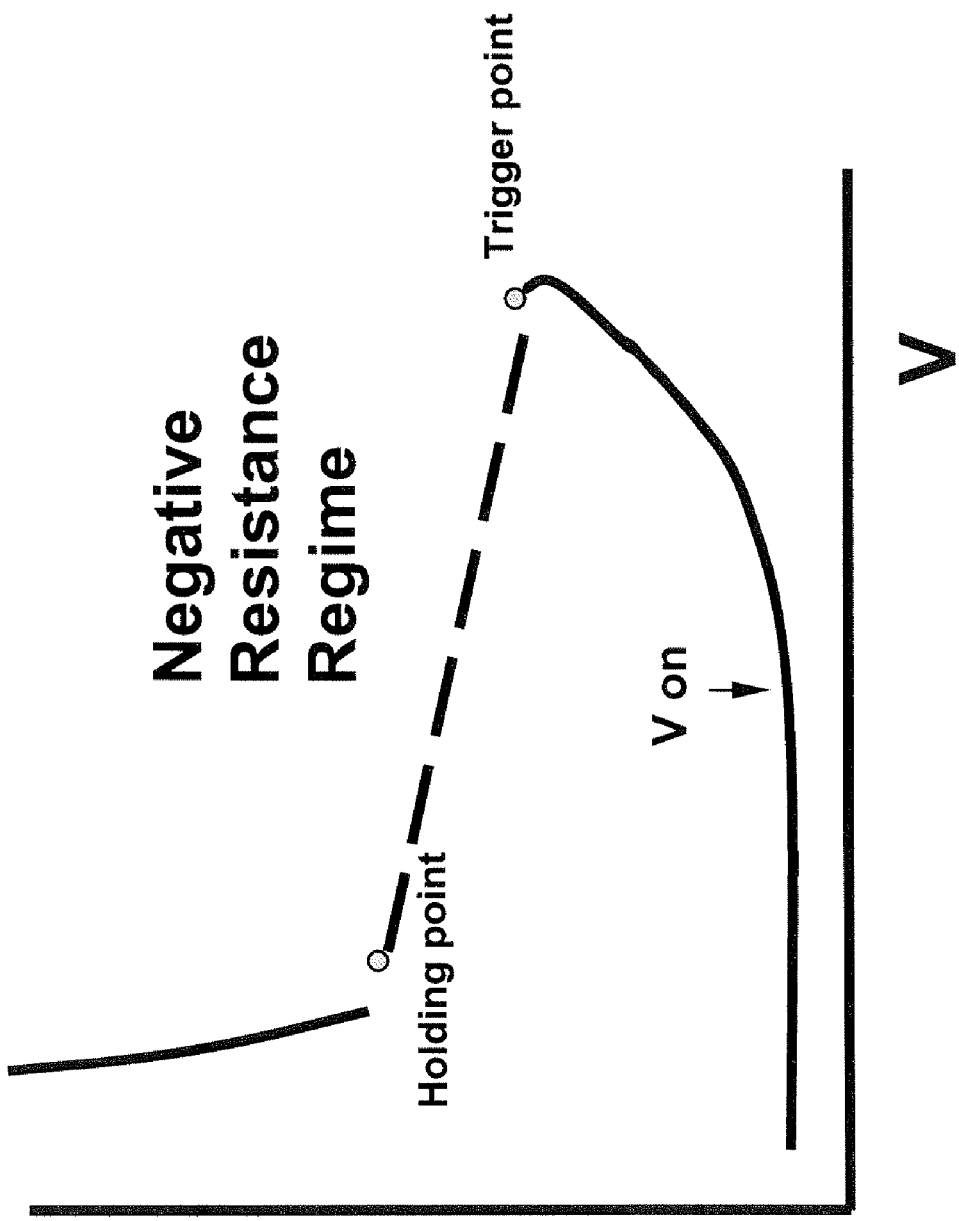
FIG. 8 shows the I-V characteristic curve of the conventional PNPN SCR device of FIGS. 7A-7B.

The conventional SCR device as shown in FIGS. 7A and 7B does not contain any trench structure, and the I-V characteristic curve of such a conventional SCR device contains a single trigger point or state, as shown in FIG. 8.

Figure 9A:
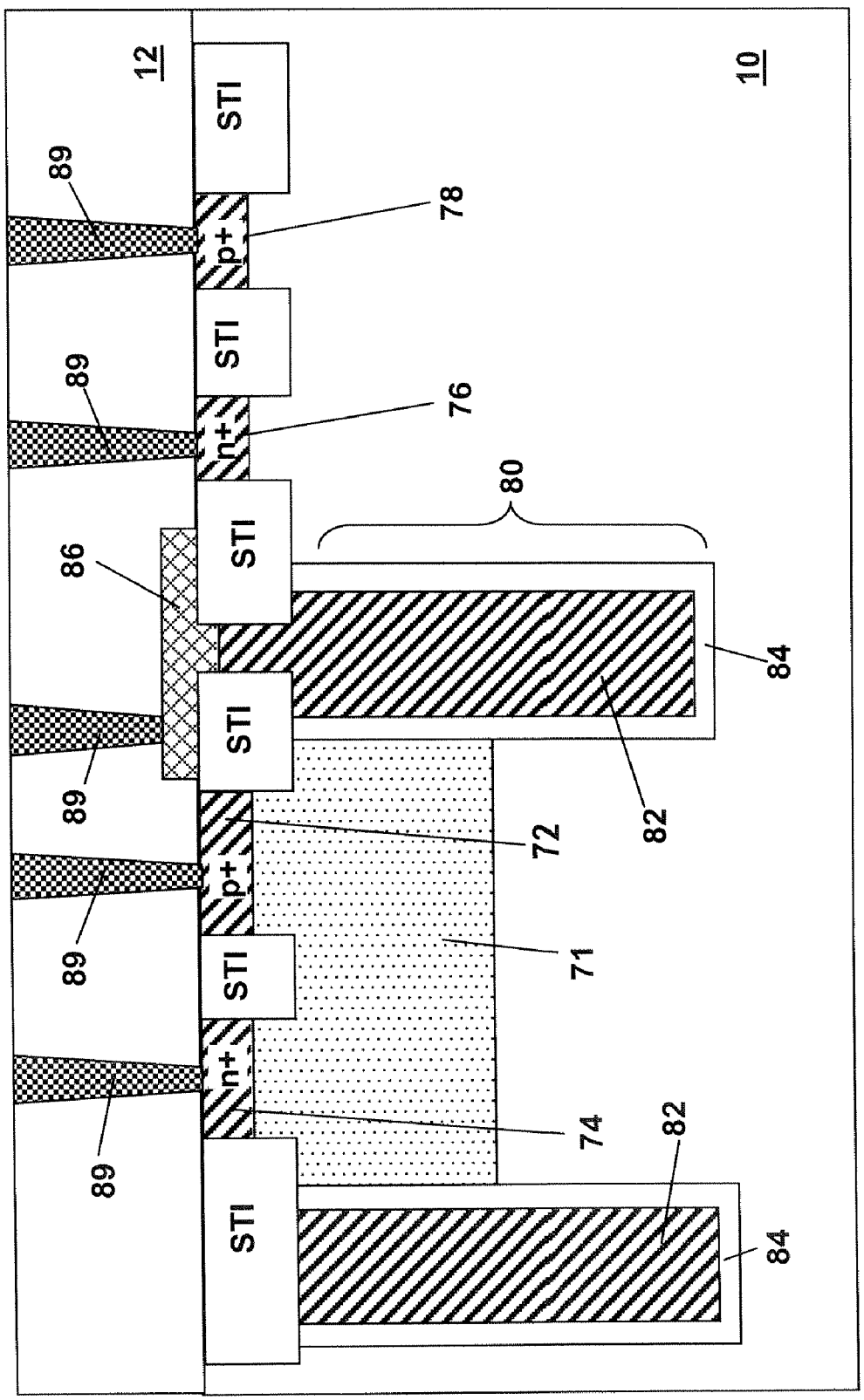
FIGS. 9A-9B are cross-sectional and top views of a trench-biased PNPN SCR device containing an n-well region encircled by a trench structure, according to one embodiment of the present invention.
Figure 9B:
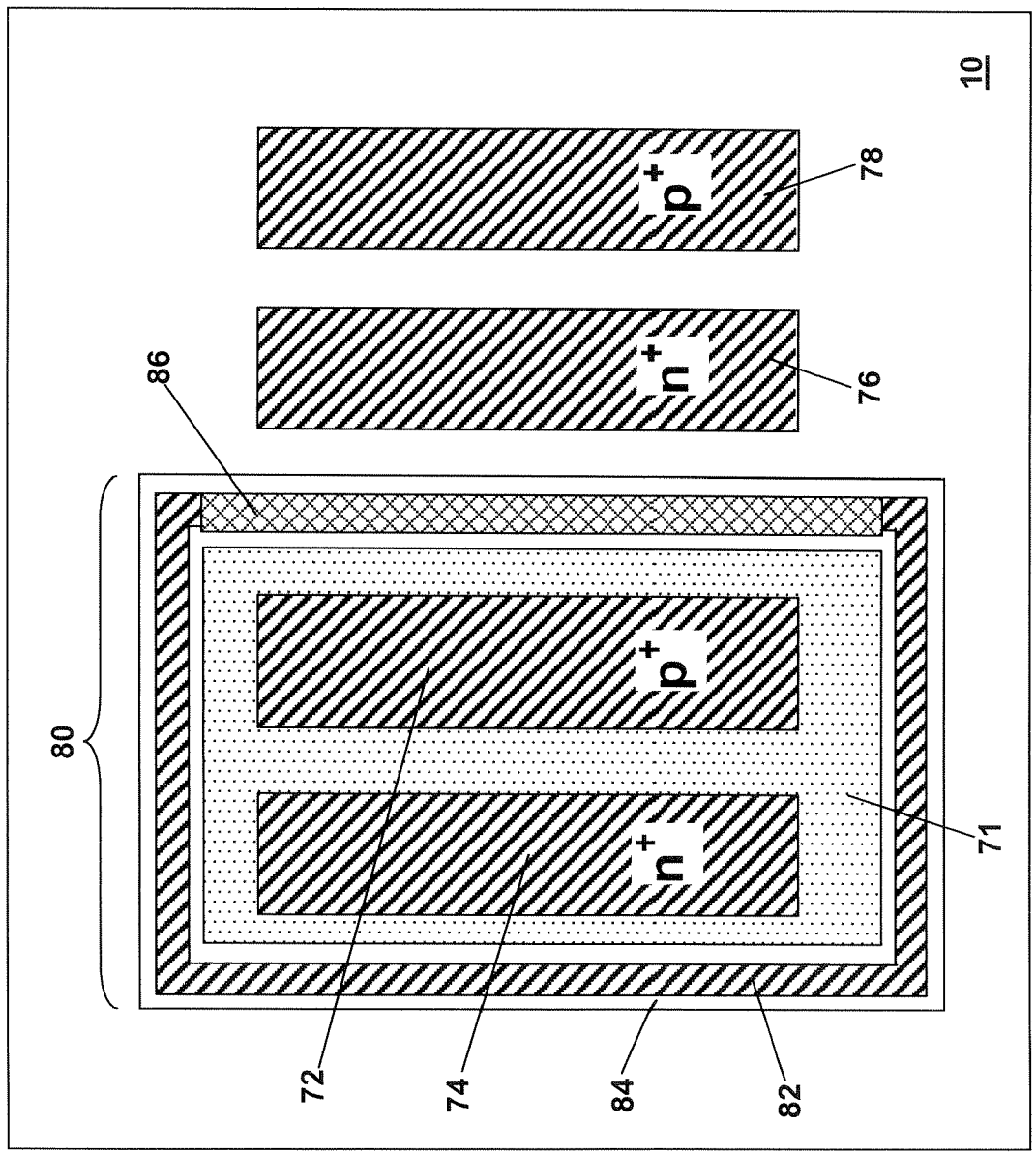
Figure 10A:
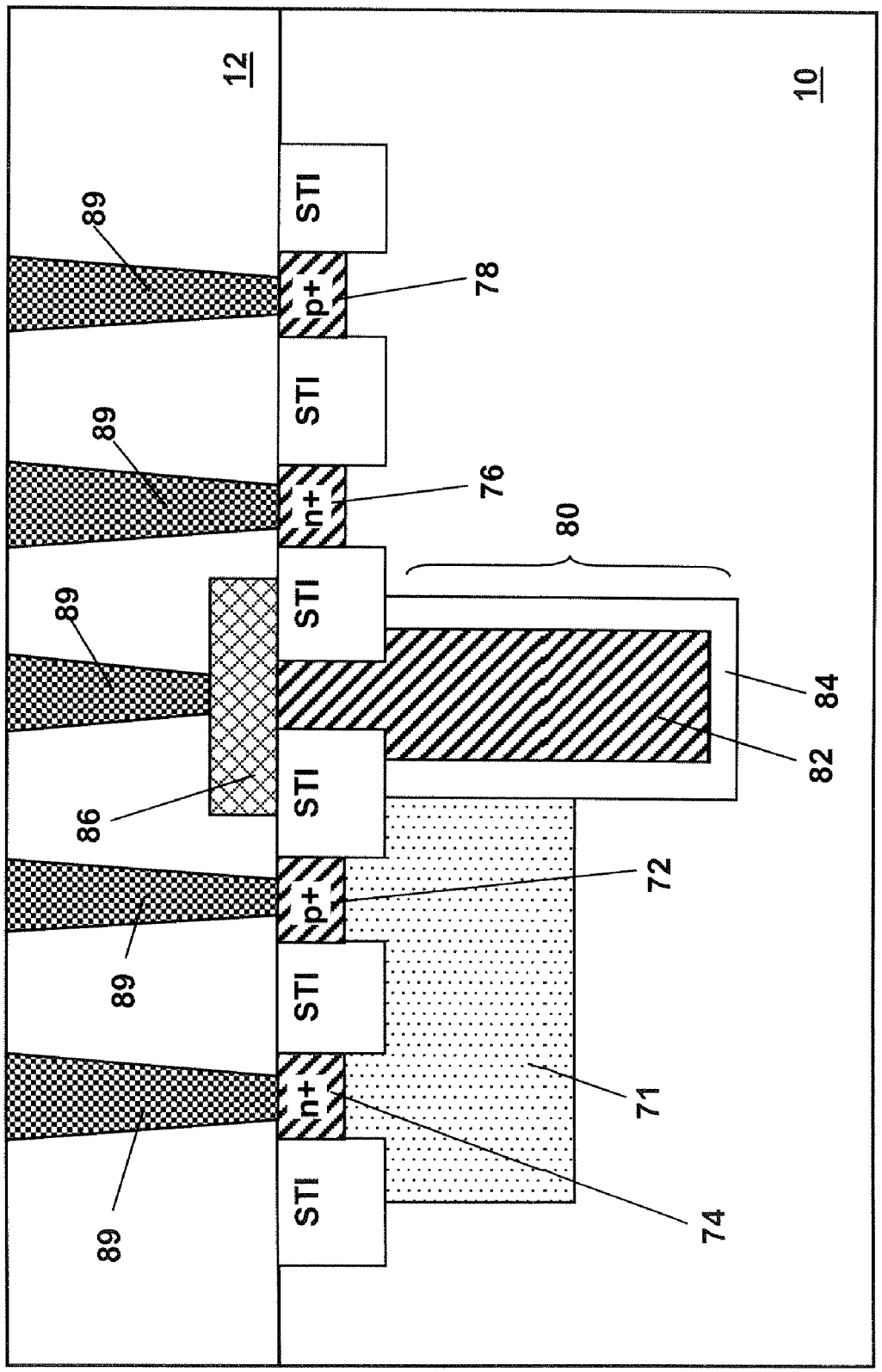
FIGS. 10A-10B are cross-sectional and top views of a trench-biased PNPN SCR device containing a trench structure located at only one side of an n-well region, according to one embodiment of the present invention.
Figure 10B:
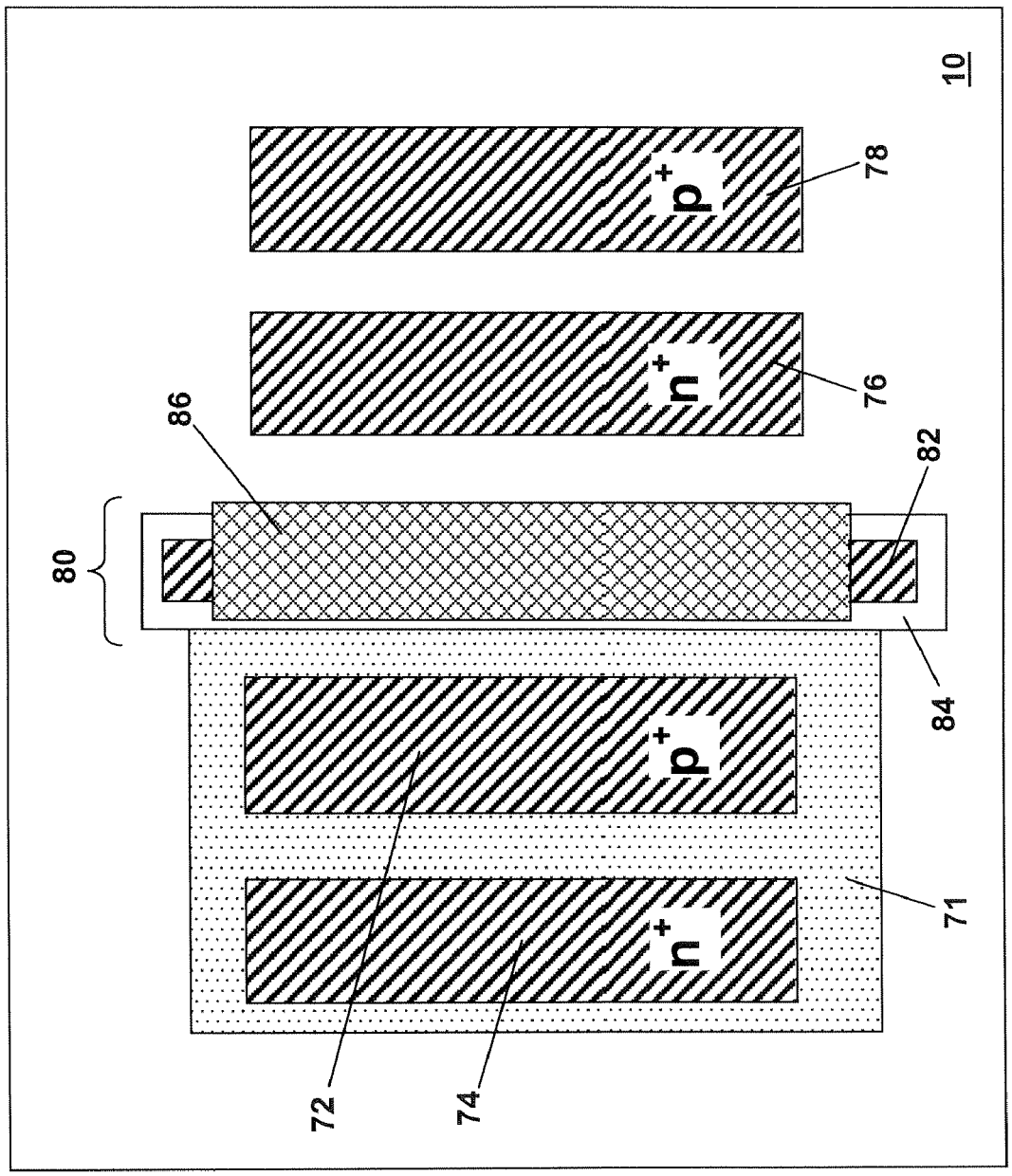
Figure 11:
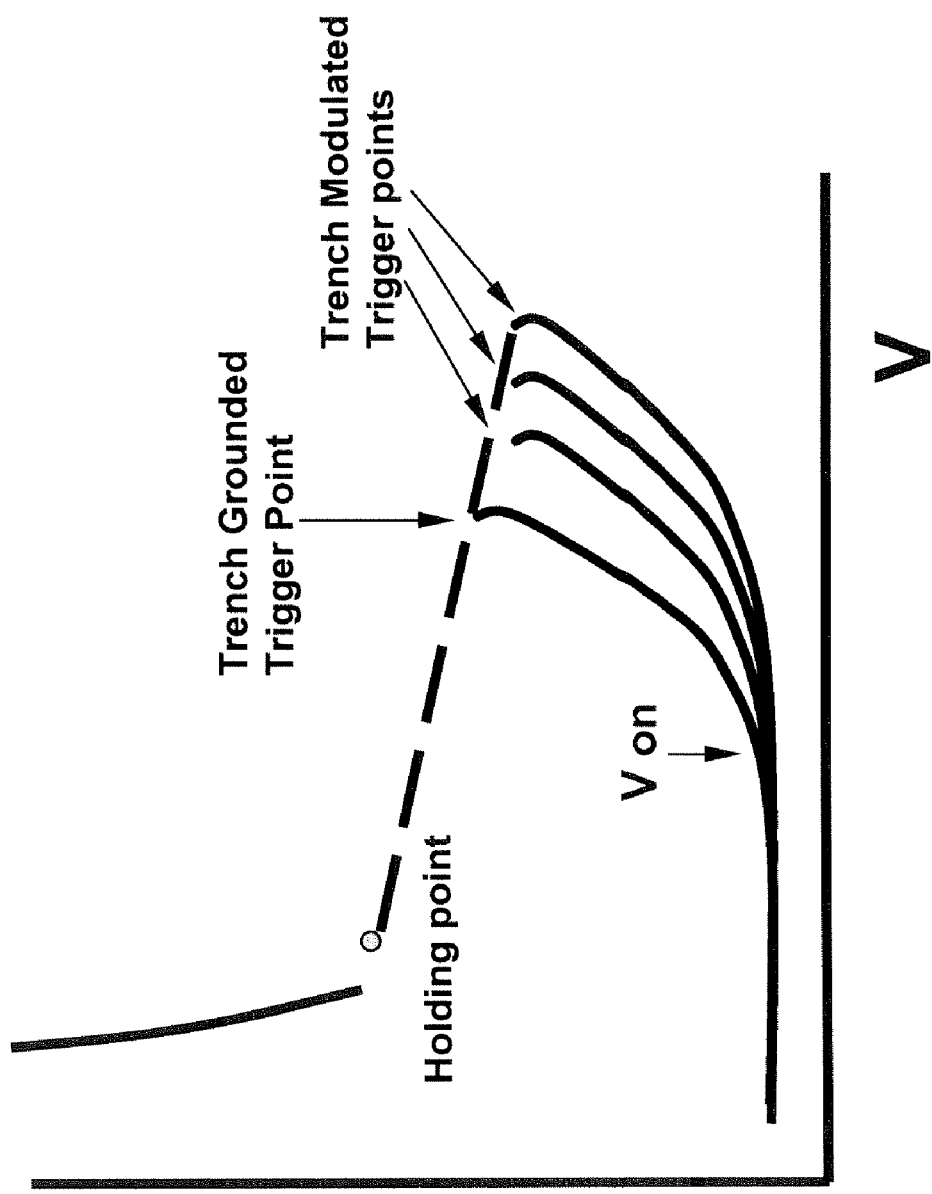
FIG. 11 shows the I-V characteristic curve of a trench-biased PNPN SCR device of the present invention.

In contrast, the trench-biased SCR devices of the present invention, as illustrated by FIGS. 9A-9B and 10A-10B, each contains a trench (ether ring-shaped as shown in FIGS. 9A-9B or linear as shown in FIGS. 10A-10B) that abuts the n-well region and is filled with a conductive or semiconductor material. The conductive or semiconductor trench fill is isolated from the surrounding n-well region and the p-doped substrate by an insulator liner that coats over the interior surfaces of the trench. In this manner, the conductive or semiconductor trench fill is "floating" and thereby serves as a capacitor divider network. Specifically, a first capacitor is formed between the trench and the n-well region, and a second capacitor is formed between the trench and the p-doped substrate. The voltage potential of the floating conductive or semiconductor trench fill is a function of the size of the capacitor formed between the trench and the n-well region and that formed between the trench and the p-doped substrate. More importantly, when a positive bias voltage is applied to the conductive or semiconductor trench fill, the trigger state of the trench-biased SCR device is changed correspondingly. In fact, the I-V characteristic curve of each of the trench-biased SCR devices of the present invention contains multiple trigger points or states that are modulated by positive trench bias voltages, as shown in FIG. 11.

Any suitable conductive or semiconductor material, including, but not limited to: metals, metal alloys, metal silicides, metal nitrides, conductive polymers, undoped Si, n-doped Si, p-doped Si, single crystal Si, polycrystalline Si, amorphous Si, Ge, SiGe, SiC, SiGeC, Ga, GaAs, InAs, InP and all other III/V or II/VI compound semiconductors, can be used for filling the trench in the present invention. Preferably, the trench fill material has a similar thermal expansion coefficient as the substrate material, so that little or no mechanical stress is created between the trench fill and the surrounding substrate material. More preferably, the trench fill material has a sufficiently high thermal stability to withstand the subsequent high temperature processing steps. In a particularly preferred (but not necessary) embodiment of the present invention, the trench is filled with polycrystalline silicon.

FIGS. 9A-9B shows the cross-sectional and top views of a trench-biased PNPN SCR device, which contains a p-doped semiconductor substrate 10 with an n-well 71 located therein. A p-type anode 72 and an optional n-doped well contact layer 74 are located over different portions of the n-well 71 and are isolated from each other by shallow trench isolations. An n-type cathode 76 and an optional p-doped substrate contact layer 78 are located over different portions of the p-dopes substrate 10 but are outside of the n-well 71. The n-type cathode 76 and the optional p-doped substrate contact layer 78 are also isolated from each other by shallow trench isolations. A ring-shaped deep trench 80, which contains an insulator liner 84 and is filled with a conductive or semiconductor material 82, is provided immediately adjacent to the n-well 71. More specifically, the ring-shaped deep trench 80 encircles the n-well 71, as shown in FIG. 9A.

A conductive layer 86 is formed over the opening of the trench 80 to provide electrical contact to the trench fill 82. In this manner, a voltage can be applied through the conductive layer 86 to bias the trench 80.

FIGS. 10A-10B are cross-sectional and top views of another trench-biased PNPN SCR device, which is similar to that illustrated by FIG. 9A-9B, with the exception that the trench 80 is a linear structure, instead of a ring-shaped structure, and it is located at only one side of the n-well 71, according to another embodiment of the present invention.

It is a surprising an un-expected discovery by the inventor of the present invention that the trench-biased PNPN SCR device as illustrated hereinabove has multiple trigger points or trigger states that are modulated by positive trench bias voltages, as shown in FIG. 11. Specifically, when the voltage of the trench 80 is biased to a ground potential (e.g., Vss), the latchup trigger voltage of the trench-biased PNPN SCR device is at a first, lower state. However, when the voltage of the trench 80 is positively biased, the latchup trigger voltage of the trench-biased PNPN SCR device changes to multiple higher states, depending on the trench bias voltage used.

More importantly, after the trench bias voltage is removed, i.e., after the trench is disconnected from the positive bias voltage, the SCR device does not undergo a transition back to the lower trigger state. Instead, it remains in the higher trigger state as if biased. It seemed that the deep trench structure of the SCR device of the present invention is capable of storing charges during the trench bias stage, and the stored charges in turn modulate the latch up state after the trench bias voltage is removed, so the SCR device can remain at the higher trigger state without decay. In fact, the latchup trigger state of the SCR device switches to the original, lower state only after the trench is biased back to the ground potential.

Therefore, the trench-biased SCR device of the present invention can be readily used as a reversibly programmable device, which can be readily programmed by applying different trench bias voltages to effectuate changes in its latchup trigger state.

Further, the trench-biased SCR device of the present invention can be used to form a memory device, which can be readily set to a base state characterized by the original, lower trigger voltage or one or more programmed states characterized by the one or more biased, higher trigger voltages. The state of the memory device does not change even after the power is turned off, and therefore it qualifies as a static memory device.

It has been known to use SCR devices in forming other logic and memory networks, such as static random access memory (SRAM) cells. It is therefore clear from the present invention that the trench-biased SCR devices can also be arranged and constructed to form more complex or higher order logic and memory networks. For example, a latch network can be constructed using two trench-biased SCR devices that are cross-coupled with each other, thereby resulting in a static random access memory (SRAM) cell.

The trench-biased SCR devices as shown in FIGS. 9A-10B contain five electrodes, including the p-type anode 72, the n-type cathode 76, a first additional electrode connected with the n-doped well contact layer 74 (and therefore with the n-well 71), a second additional electrode connected with the p-doped substrate contact layer 78 (and therefore with the p-substrate 10), and a third additional connected with the conductive contact 86 (and therefore with the trench fill 82).

Alternatively, the trench-biased SCR devices of the present invention may contain four electrodes, if the conductive layer 86 extends to make further contact with the n-well 71 or the p-substrate 10. In this manner, either the n-well 71 or the p-substrate 10 is "strapped" to the trench fill 82 by the conductive layer 86, and a single electrode can be used for the trench fill 82 and the "strapped" n-well 71 or p-substrate 10.

Figure 12:
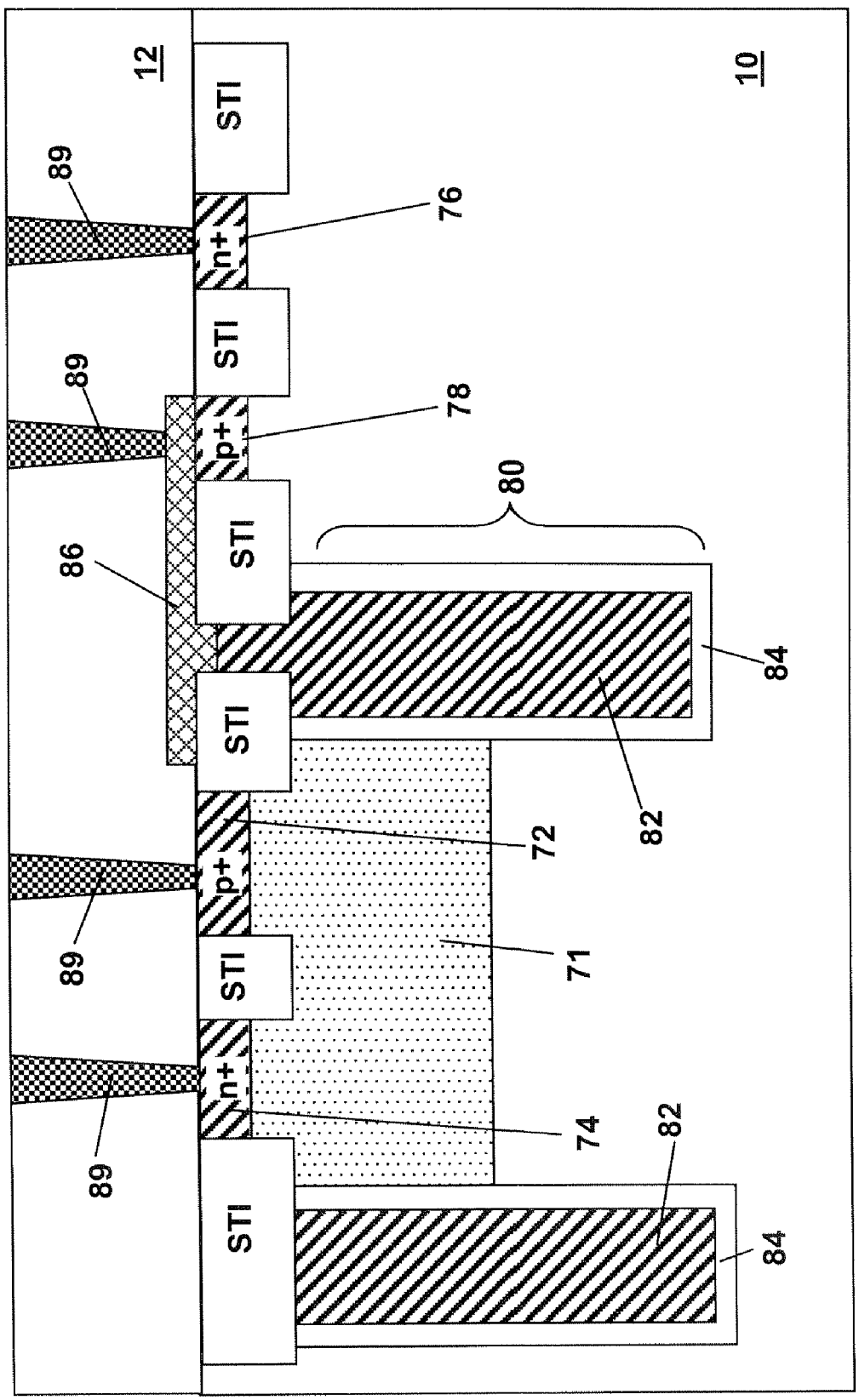
FIG. 12 is a cross-sectional view of a trench-biased PNPN SCR device having its trench structure and its p-doped substrate strapped together by a conductive layer, according to one embodiment of the present invention.

FIG. 12 is a cross-sectional view of a trench-biased PNPN SCR device having its trench fill 82 and its p-doped substrate 10 strapped together by the conductive layer 86, according to one embodiment of the present invention. Specifically, the conductive layer 86 extends to make further contact with the p-doped substrate contact layer 78 (therefore with the p-doped substrate 10). Correspondingly, a single electrode is provided for both the trench fill 82 and the strapped p-substrate 10.

Figure 13:
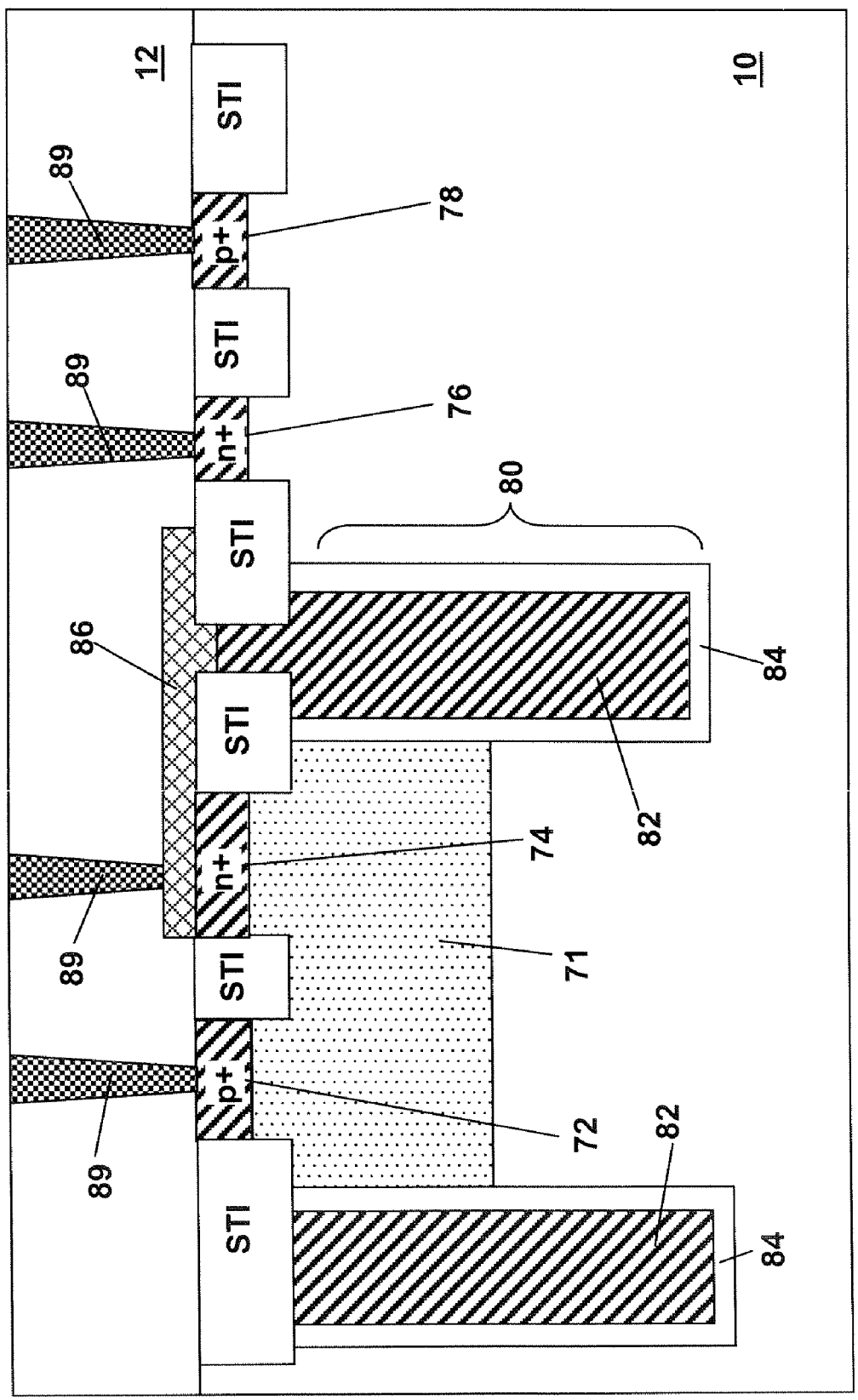
FIG. 13 is a cross-sectional view of a trench-biased PNPN SCR device having its trench structure and its n-well strapped together by a conductive layer, according to one embodiment of the present invention.

FIG. 13 is a cross-sectional view of a trench-biased PNPN SCR device having its trench fill 82 and its n-well 71 strapped together by the conductive layer 86, according to one embodiment of the present invention. Specifically, the conductive layer 86 extends to make further contact with the n-doped well contact layer 74 (therefore with the n-well 71). Correspondingly, a single electrode is provided for both the trench fill 82 and the strapped n-well 71.

Although FIGS. 9A-13 primarily depict trench-biased PNPN SCR devices for illustration purposes, it is readily understood that similar trench-biased NPNP SCR device with opposite doping profiles are also contemplated by the present invention. Specifically, a trench-biased NPNP SCR device of the present invention comprises an n-doped substrate with a p-doped well region, with an n-type cathode located over the p-doped well region, a p-type anode located over the n-doped substrate, and a deep trench located in the n-doped substrate immediately abutting the p-doped well region. Such a trench-biased NPNP SCR device, although not specifically shown by the drawing figures, functions in substantially the same manner as the above-described PNPN SCR device and is therefore also within the scope of the present invention.

While the invention has been described herein with reference to specific embodiments, features and aspects, it will be recognized that the invention is not thus limited, but rather extends in utility to other modifications, variations, applications, and embodiments, and accordingly all such other modifications, variations, applications, and embodiments are to be regarded as being within the spirit and scope of the invention. It should therefore be recognized that the present invention is not limited to the specific embodiment illustrated hereinabove, but rather extends in utility to any other modification, variation, application, and embodiment, and accordingly all such other modifications, variations, applications, and embodiments are to be regarded as being within the spirit and scope of the invention.

What is claimed is:

1. An integrated semiconductor device comprising:
   a semiconductor substrate;
   a first semiconductor device comprising a heterojunction bipolar transistor (HBT) located in a first region of the semiconductor substrate, wherein said HBT comprises a base region containing a first portion of a SiGe or SiGeC layer; and
   a second semiconductor device located in a second region of the semiconductor substrate, wherein said second semiconductor device comprises an interconnect containing a second portion of the SiGe or SiGeC layer; and
   wherein the second portion of the SiGe or SiGeC layer is coplanar with an upper surface of the semiconductor substrate.

2. The integrated semiconductor device of claim 1, wherein the second portion of the SiGe or SiGeC layer comprises a polycrystalline section and a single crystal section.

3. The integrated semiconductor device of claim 1, wherein said second semiconductor device comprises a memory device including a trench capacitor and a field effect transistor (FET) that are electrically connected together by the second portion of the SiGe or SiGeC layer.

4. The integrated semiconductor device of claim 1, wherein the semiconductor substrate is doped with a p-type dopant species, wherein said second semiconductor device comprises a trench-biased PNPN silicon controlled rectifier, which includes a p-type anode that is located over an n-well in the semiconductor substrate, an n-type cathode that is located over the semiconductor substrate and is spaced apart from the n-well, and a polysilicon-filled trench that is located in the semiconductor substrate abutting the n-well region, and wherein the second portion of the SiGe or SiGeC layer is located over and electrically contacts the polysilicon-filled trench for applying a bias voltage to said trench.

5. The integrated semiconductor device of claim 4, wherein the polysilicon-filled trench encircles the n-well.

6. The integrated semiconductor device of claim 4, wherein the polysilicon-filled trench is located at one side of the n-well between the n-well and the n-cathode.

7. The integrated semiconductor device of claim 4, wherein the trench-biased PNPN silicon controlled rectifier comprises five electrodes, which include the p-type anode, the n-type cathode, a first additional electrode electrically connected with the n-well, a second additional electrode electrically connected with the p-doped semiconductor substrate, and a third additional electrode electrically connected with the second portion of the SiGe or SiGeC layer.

8. The integrated semiconductor device of claim 4, wherein the second portion of the SiGe or SiGeC layer extends to form further electrical contact with the p-doped semiconductor substrate, and wherein the trench-biased PNPN silicon controlled rectifier comprises four electrodes, which include the p-type anode, the n-type cathode, a first additional electrode electrically connected with the n-well, and a second additional electrode electrically connected with the second portion of the SiGe or SiGeC layer.

9. The integrated semiconductor device of claim 4, wherein the second portion of the SiGe or SiGeC layer extends to further form electrical contact with the n-well, and wherein the trench-biased PNPN silicon controlled rectifier comprises four electrodes, which include the p-type anode, the n-type cathode, a first additional electrode electrically connected with the p-doped semiconductor substrate, and a second additional electrode electrically connected with the second portion of the SiGe or SiGeC layer.

10. A method for forming an integrated semiconductor device comprising:
    providing a semiconductor substrate;
    forming a first semiconductor device comprising a heterojunction bipolar transistor (HBT) in a first region of the semiconductor substrate and a second semiconductor device in a second region of the semiconductor substrate;
    forming a SiGe or SiGeC layer over the first and second regions, wherein a first portion of the SiGe or SiGeC layer forms a base region in the HBT, and wherein a second portion of the SiGe or SiGeC layer forms an interconnect in said second semiconductor device; and
    wherein the second portion of the SiGe or SiGeC layer is coplanar with an upper surface of the semiconductor substrate.

11. The method of claim 10, wherein the second semiconductor device comprises a memory device including a trench capacitor and a field effect transistor (FET) that are electrically connected together by the second portion of the SiGe or SiGeC layer.

12. The method of claim 10, wherein the second semiconductor device comprises a trench-biased PNPN silicon controlled rectifier, which includes a p-type anode that is located over an n-well in the semiconductor substrate, an n-type cathode that is located over the semiconductor substrate and is spaced apart from the n-well, and a polysilicon-filled trench that is located in the semiconductor substrate abutting the n-well region, and wherein the second portion of the SiGe or SiGeC layer is located over and electrically contacts the polysilicon-filled trench for applying a bias voltage to said trench.

* * * * *